(12) United States Patent
Kawakami et al.

(10) Patent No.: US 7,667,312 B2
(45) Date of Patent: Feb. 23, 2010

(54) SEMICONDUCTOR DEVICE INCLUDING A HEAT-TRANSMITTING AND ELECTROMAGNETIC-NOISE-BLOCKING SUBSTANCE AND METHOD OF MANUFACTURING THE SAME

(75) Inventors: Satoko Kawakami, Kanagawa (JP);
Yoichiro Kurita, Kanagawa (JP);
Takehiro Kimura, Kanagawa (JP);
Ryuya Kuroda, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/658,170

(22) Filed: Sep. 9, 2003

(65) Prior Publication Data
US 2004/0051170 A1    Mar. 18, 2004

(30) Foreign Application Priority Data
Sep. 18, 2002    (JP)    ............. 2002-272310

(51) Int. Cl.
*H01L 23/02*    (2006.01)
(52) U.S. Cl. ............. 257/686; 257/712; 257/777; 257/E25.006; 257/E23.085
(58) Field of Classification Search .......... 257/685, 257/686, 723–724, 777–778, 659, 773, 784, 257/730, 706, 712, 787, 720, 786, 796, 665, 257/E25.006, E25.013, E25.018, E25.021, 257/E25.027, E21.614, E23.085
See application file for complete search history.

(56) References Cited

U.S. PATENT DOCUMENTS 5,317,107 A * 5/1994 Osorio ............. 257/659
6,472,747 B2 * 10/2002 Bazarjani et al. ............. 257/724
6,617,695 B1 * 9/2003 Kasatani ............. 257/778
6,882,042 B2 * 4/2005 Zhao et al. ............. 257/706
2002/0121679 A1    9/2002 Bazarjani et al.

(Continued)

FOREIGN PATENT DOCUMENTS

JP    2000-269411    9/2000

(Continued)

OTHER PUBLICATIONS

Korean Patent Office Action of Sep. 12, 2005.

(Continued)

*Primary Examiner*—Davienne Monbleau
*Assistant Examiner*—Dilinh P Nguyen
(74) *Attorney, Agent, or Firm*—Darryl G. Walker

(57) ABSTRACT

In a multi-chip package having vertically stacked semiconductor integrated circuits (chips), a heat transmitting conductive plate (5) can be interposed between a lower layer semiconductor chip (3) and an upper layer semiconductor chip (4) and connected to a ground wiring of a substrate (2) through a bonding wire (9). A heating transmitting conductive plate (5) at the ground potential can block propagation of noise between the lower layer semiconductor chip (3) and upper layer semiconductor chip (4). Thus, the addition of noise to signals of an analog circuit in the upper layer semiconductor chip (4) can be avoided, reducing noise induced malfunctions. Furthermore, heat generated by the lower layer semiconductor chip (3) and upper layer semiconductor chip (4) can be transmitted through contact points with the heat transmitting conductive plate (5) for dissipation therefrom. This can improve heat dissipating capabilities of the semiconductor device (1) contributing to more stable operation.

7 Claims, 14 Drawing Sheets

U.S. PATENT DOCUMENTS

| | | | |
|---|---|---|---|
| 2004/0063246 A1* | 4/2004 | Karnezos | 438/108 |
| 2004/0113254 A1* | 6/2004 | Karnezos | 257/686 |
| 2004/0195591 A1* | 10/2004 | Gehman et al. | 257/202 |

FOREIGN PATENT DOCUMENTS

| | | |
|---|---|---|
| JP | 2000-294723 | 10/2000 |
| JP | 2001-077297 | 3/2001 |
| JP | 2001-135777 | 5/2001 |
| JP | 2001-177051 | 6/2001 |
| JP | 2001-250836 | 9/2001 |
| JP | 2001-308258 | 11/2001 |
| JP | 2002-009226 | 1/2002 |
| JP | 2002-043501 | 2/2002 |
| JP | 2002-110902 | 4/2002 |
| JP | 2002-134685 | 5/2002 |
| JP | 2002-151644 | 5/2002 |
| KR | 10-0277882 | 6/2000 |
| KR | 10-2002-0043395 | 6/2002 |

OTHER PUBLICATIONS

Japanese Translations of the above-referenced Korean Patent Office Action.
English Translations of the indicated portions of the above-referenced Japanese Translation.
Office Action dated May 8, 2007 from Japanese Patent Office.
Translations of selected portions of Office Action dated May 8, 2007 from Japanese Patent Office.

* cited by examiner

US 7,667,312 B2

SEMICONDUCTOR DEVICE INCLUDING A HEAT-TRANSMITTING AND ELECTROMAGNETIC-NOISE-BLOCKING SUBSTANCE AND METHOD OF MANUFACTURING THE SAME

TECHNICAL FIELD

The present invention relates to generally to a semiconductor device and method for mounting multiple semiconductor integrated circuits (chips) in a single package, and more particularly to vertical packaging type semiconductor device and manufacturing method for the same.

BACKGROUND OF THE INVENTION

A semiconductor device package type and method that is recently come into use is the multi-chip package (MCP). A multi-chip package can include multiple integrated circuit (IC) chips contained in a single package. This can raise chip packaging density, which can meet the demand for reductions in component/device size.

Multi-chip packages can be classified into planar packaging types, in which multiple chips are mounted on the same substrate that forms a plane, and vertical packaging types, in which multiple chips are arranged in vertical direction to form a stacked structure.

A conventional planar packaging type semiconductor device is set forth in a side cross sectional view in FIG. 31. The conventional semiconductor device is designated by the general reference character 101, and can include semiconductor chips 103 and 104, each having memory circuit formed thereon, and arranged in the same plane.

A known conventional vertical packaging type semiconductor device is shown in FIG. 32 in a side cross sectional view. In this example, conventional semiconductor device 108 can include semiconductor chips 106 and 107 stacked on a substrate 105. Circuit faces for semiconductor chips (106 and 107) can be turned upward (i.e., toward the top of the figure in FIG. 32).

Another conventional vertical packaging type semiconductor device is shown in a side cross sectional view in FIG. 33, and designated by the general reference character 112. FIG. 33 shows a chip-on-chip (COC) device 112 in which semiconductor chips 110 and 111 are arranged on a substrate 109 with their circuit faces opposing one another.

A conventional method of manufacturing a vertical packaging type multi-chip semiconductor device will now be described.

Referring to FIG. 34(a), in a conventional method of manufacturing a COC type device, a first step is to mount a lower side of semiconductor chip 110 onto a substrate 109 by dripping or applying an adhesive 113 onto the substrate 109 and then attaching semiconductor chip 110 to the substrate 109.

Referring to FIG. 34(b), the adhesive 113 may then be cured and bumps 110a can be formed on the circuit face of semiconductor chip 110.

Referring to FIG. 34(c), an upper side (e.g., a circuit face) of semiconductor chip 111 can be mounted onto semiconductor chip 110 so that electrodes of the semiconductor chips (110 and 111) are brought into contact with one another. The semiconductor chips (110 and 111) are then joined by a hot press fit. Thereafter, the semiconductor chips (110 and 111) are sealed with a resin to obtain the semiconductor device 112 shown in FIG. 33.

As shown in FIG. 34(c), in the manufacture of a conventional semiconductor device employing a vertical type multi-chip package, an adhesive may be uneven in thickness after curing. This can cause a tilt to occur in the semiconductor device (e.g., 110) with respect to a substrate surface (e.g., 109). Such a tilt can result in uneven force being applied to different portions of semiconductor device 110 when the other semiconductor device 111 is attached thereto. Such uneven force can damage circuit components on the face of semiconductor device 110.

Semiconductor devices employing vertical packaging type arrangements for a multi-chip package can reduce overall device sizes. However, such arrangements can have drawbacks in the event one or more of the included semiconductor chips consumes a large amount of power. In particular, when a semiconductor device consumes a large amount of a power, it generates a correspondingly large amount of heat. Conventional vertical packaging types, like those described above, may not provide sufficient heat dissipation. As a result, chips within the multi-chip package can overheat, resulting in malfunctions or damage to the device.

To address heat dissipation needs for a multi-chip package, conventional techniques are proposed that include placing a heat dissipating metal plate above an upper side of semiconductor chip or between semiconductor chips. One such conventional example is disclosed in Japanese Patent Publication 2000-294723A.

The technique disclosed in the above publication can have drawbacks in certain applications. For example, a semiconductor chip with an analog circuit can be mounted with a semiconductor chip with a digital circuit in order to provide multiple device functions. However, in such an arrangement noise generated from one semiconductor chip can adversely affect the other semiconductor chip.

That is, while the above conventional technique aims to improve heat dissipation capabilities, such a technique does not provide a countermeasure against noise. Therefore, multi-chip packages which include a heat dissipating metal plate that seek to include an analog circuit, which can be particularly susceptible to noise, may more readily draw in noise, causing a malfunction and/or a decline in reliability.

This can make it difficult to reduce overall package size when employing a vertical packaging type multi-chip package.

In light of the above, it would be desirable to arrive at a vertical packaging type semiconductor device and manufacturing method that can ensure high reliability by providing sufficient heat dissipation, while at the same time reducing or eliminating susceptibility to noise, as compared to conventional approaches.

SUMMARY OF THE INVENTION

The present invention can include a semiconductor device having at least one semiconductor integrated circuit (chip) mounted thereon. The semiconductor device can include at least one semiconductor chip mounted over a substrate, and at least one heat transmitting conductor interposed between the at least one semiconductor chip and the substrate that is electrically connected to a ground wiring of the substrate. The ground wiring can supply a ground potential. At least one heat transmitting conductor can diffuse heat generated by at least one semiconductor chip, and can block electromagnetic noise from affecting the semiconductor chip.

According to one aspect of the embodiments, the semiconductor device can include a plurality of semiconductor chips stacked in a vertical direction over the substrate.

According to another aspect of the embodiments, the plurality of semiconductor chips can include a first semiconductor chip and second semiconductor chip stacked adjacent to one another. Both such chips can have circuit forming faces facing upward, away from the substrate. In addition, at least one heat transmitting conductor can be interposed between the first semiconductor chip and second semiconductor chip.

According to another aspect of the embodiments, each of the plurality of semiconductor chips can be electrically connected to the substrate by a plurality of signal wires. At least one heat transmitting conductor can be connected to the substrate by at least one ground wire.

According to another aspect of the embodiments, the plurality of semiconductor chips can include a first semiconductor chip and second semiconductor chip stacked adjacent to one another. The chips can have circuit forming faces opposing one another. At least one heat transmitting conductor can be interposed between the first semiconductor chip and second semiconductor chip.

According to another aspect of the embodiments, at least one heat transmitting conductor can comprise a laminate structure having at least one heat transmitting conductive layer electrically and thermally connected to the ground wiring of the substrate, and at least one connection wiring layer electrically connecting a substrate conductor with at least one terminal of one of the plurality of semiconductor chips.

According to another aspect of the embodiments, at least one heat transmitting conductor can comprise a laminate structure having at least one heat transmitting conductive layer electrically and thermally connected to the ground wiring of the substrate, and at least one connection wiring layer electrically connecting corresponding terminals of the first semiconductor chip and second semiconductor chip to one another.

According to another aspect of the embodiments, first and second semiconductor chips can be electrically connected to one another directly through at least one heat transmitting conductor.

According to another aspect of the embodiments, a semiconductor chip closest to the substrate can be electrically connected to the substrate by at least one wire.

According to another aspect of the embodiments, at least one of the plurality of semiconductor chips can have a digital circuit formed therein, while another of the plurality of semiconductor chips can have an analog circuit formed therein.

According to another aspect of the embodiments, at least one heat transmitting conductor can comprise a metal plate.

According to another aspect of the embodiments, at least one heat transmitting conductor can comprise a sheet like-member having at least one metal layer formed therein.

According to another aspect of the embodiments, a ground wiring can be formed along substantially the entire perimeter of a top face of the substrate.

According to another aspect of the embodiments, a heat dissipating member can be physically connected to a ground wiring, and can be and provided on a side face of the semiconductor device. In addition, the semiconductor device can be sealed with a resin-like material that exposes at least a portion of the heat dissipating member.

The present invention can also include a method of manufacturing a semiconductor device. The method can include the steps of: mounting a first semiconductor integrated circuit (chip) to a mount portion of a substrate with an adhesive material; inserting at least one projecting suction member through at least one opening in the substrate to horizontally support the first semiconductor chip by suction without regard to any tilt in the orientation of the substrate with respect to the first semiconductor chip; and lowering a second semiconductor chip that is maintained parallel to the first semiconductor chip to bring electrodes of the second semiconductor chip into electrical connection with corresponding electrodes of the first semiconductor chip.

According to one aspect of the embodiments, the substrate can comprise a lead frame having a mounting portion that is smaller than the first semiconductor chip. At least one opening for receiving a projecting suction member can be situated around the lead frame mounting portion.

According to another aspect of the embodiments, the substrate can comprise a printed wiring board-type structure, and the least one opening can pre-formed in the printed wiring board-type structure.

According to another aspect of the embodiments, a method of manufacturing a semiconductor device can further include, prior to lowering the second semiconductor chip, lowering a heat transmitting conductor that is maintained parallel to the first semiconductor chip onto a position over the first semiconductor chip. In addition, the step of lowering a second semiconductor chip can include maintaining the second semiconductor chip parallel to the heat transmitting conductor.

According to another aspect of the embodiments, the first semiconductor chip can include first connection terminals. The step of lowering the heat transmitting conductor can include positioning the heat transmitting conductor so that connection holes formed therein are aligned over the first connection terminals. Further, the step of lowering the second semiconductor chip can include positioning the second semiconductor chip so that second connection terminal formed thereon contact corresponding first connection terminals through the connection holes.

According to another aspect of the embodiments, a heat transmitting conductor may take various forms, including: a conductive plate, a conductive sheet, a metal plate, a metal sheet, a conductive sheet having shield portion and at least one lead portion extending from a corner thereof, a conductive sheet having shield portion and at least one lead portion extending from an edge thereof, a laminate structure comprising a conductive heat transmitting layer and at least one wiring layer for electrically connecting the first semiconductor chip with the second semiconductor chip, a laminate structure comprising a conductive heat transmitting layer and a plurality of connection holes formed therein for enabling direct electrical connections between the first semiconductor chip and the second semiconductor chip, a laminate structure comprising a conductive heat transmitting layer and at least one wiring layer for electrically connecting at least one of the semiconductor chips to substrate wiring connections, a structure comprising aluminum, a structure comprising copper, chromium, and a structure comprising silver.

DETAILED DESCRIPTION OF THE EMBODIMENTS

Various embodiments of the present invention will now be described in detail with reference to accompanying drawings.

A first embodiment will now be described.

Figure 1:
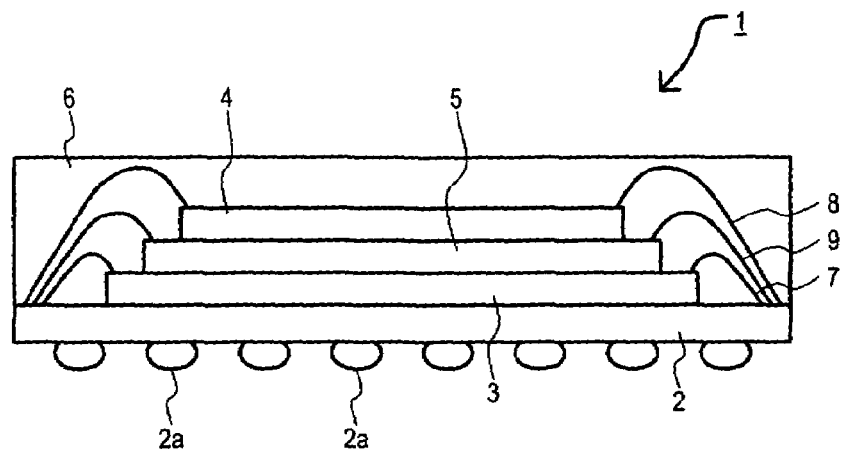
FIG. 1 is a side cross sectional view of a semiconductor device according to a first embodiment of the present invention.

A semiconductor device according to a first embodiment of the present invention is set forth in a side cross sectional view in FIG. 1, and designated by the general reference character 1.

A semiconductor device 1 according to a first embodiment can include two semiconductor chips vertically mounted thereto. In particular, a semiconductor device 1 can include a substrate 2, a lower layer semiconductor chip 3, and an upper layer semiconductor chip 4. A substrate 2 can be a ball grid array (BGA) type substrate that includes ball-like bumps (two of which are shown as 2$a$) which can be provided as external connection electrodes. Ball-like bumps 2$a$ can be arranged in a grid-like pattern on a bottom surface of substrate 2. Further, substrate 2 can include a circuit pattern providing a particular electrical connection to ball-like bumps. As but one example, such a circuit pattern can be formed by printed circuit methods.

A lower layer semiconductor chip 3 can have a digital circuit formed thereon, for example. An upper layer semiconductor chip 4 can have an analog circuit formed thereon, for example. Circuit faces for both a semiconductor chip 3 and semiconductor chip 4 can be arranged upward (toward the top of the figure in FIG. 1).

A semiconductor device 1 according to a first embodiment may also include a heat transmitting conductive plate (heat transmitting conductor) 5 interposed between semiconductor chip 3 and semiconductor chip 4. A heat transmitting conductive plate 5 can be composed of a metal plate. More particularly, heat transmitting conductive plate 5 can be a plate-like member formed from aluminum, or the like, having a thickness of about 20 microns (μm) to 150 μm, for example.

A semiconductor device 1 may further include a mold resin 6 for sealing the components therein.

Referring still to FIG. 1, a lower layer semiconductor chip 3 and upper layer semiconductor chip 4 can be connected to a substrate 2 with bonding wires 7 and 8, respectively. In addition, and in contrast to conventional approaches, heat transmitting conductive plate 5 can be connected to a substrate by one or more bond wires 9. More particularly, heat transmitting conductive plate 5 can be connected to a static potential wiring of substrate 2. Even more particularly, heat transmitting conductive plate 5 can be connected to a ground wiring of substrate 2.

In the particular example of FIG. 1, a heat transmitting conductive plate 5 can be smaller in size than lower layer semiconductor chip 3, and larger in size than upper layer semiconductor chip 4.

Further, in the arrangement of FIG. 1, a lower layer semiconductor chip 3 can be temporarily bonded to a substrate 2 with an adhesive. A heat transmitting conductive plate 5 can be temporarily bonded to the lower layer semiconductor chip 3 with an adhesive. An upper layer semiconductor chip 4 can be temporarily bonded to heat transmitting conductive plate 5 with an adhesive.

The operation of a semiconductor device 1 according to a first embodiment will now be described.

Referring still to FIG. 1, a heat transmitting conductive plate 5 can be interposed between a lower layer semiconductor chip 3 and an upper layer semiconductor chip 4. As noted above, heat transmitting conductive plate 5 can be connected to a ground wiring of a substrate through at least one bonding wire 9.

In such an arrangement, a heat transmitting conductive plate 5 can be maintained at a ground potential, and thus block the propagation of noise between a lower layer semiconductor chip 3 and an upper layer semiconductor chip 4.

As but one example, noise emitted from a digital circuit of lower layer semiconductor chip 3 traveling toward an analog circuit in an upper layer semiconductor chip 4 can be blocked by heat transmitting conductive plate 5. As a result, noise may not adversely affect signals of an analog circuit in upper layer semiconductor chip 4. Similarly, noise emitted from an analog circuit of upper layer semiconductor chip 4 traveling toward a digital circuit in a lower layer semiconductor chip 3 can also be blocked by heat transmitting conductive plate 5. As a result, noise may not adversely affect signals of a digital circuit in lower layer semiconductor chip 3.

In this way, malfunctions due to the addition of noise to a signal in an analog circuit of an upper layer semiconductor chip 4 can be avoided. Similarly, inversions and/or delays of signals due to noise in a digital circuit of a lower layer semiconductor chip 3 can likewise be avoided.

Still further, heat generated in a lower layer semiconductor chip 3 and an upper layer semiconductor chip 4 can be transmitted through contact points with heat transmitting conductive plate 5. Heat transmitting conductive plate 5 can then dissipate such heat. This can reduce thermal resistance of a lower layer semiconductor chip 3 and upper layer semiconductor chip 4 to external surface (package surface) of mold resin 6.

As has been described above, according to a structure of a first embodiment, a lower layer semiconductor chip 3 can be arranged in a vertical direction with an upper layer semiconductor chip 4. Thus, reductions in package size can be achieved. At the same time, and in contrast with conventional approaches, propagation of noise between a lower layer semiconductor chip 3 and an upper layer semiconductor chip 4 can be blocked by a heat transmitting conductive plate 5 interposed therebetween, by placing such a heat transmitting conductive plate 5 at a static (e.g., ground) potential.

Accordingly, malfunctions due to the addition of noise to a signal in an analog circuit of an upper layer semiconductor device 4 and inversions and/or delays of signals in a digital circuit of a lower layer semiconductor device 3 can be avoided, and thus reliability can be improved.

Further, heat generated in a lower and/or upper layer semiconductor chip (3 and 4) can be transmitted through contact points to heat transmitting conductive plate 5 for dissipation. This can reduce thermal resistance of a lower and/or upper layer semiconductor chip (3 and 4) to external surface (package surface) of mold resin 6, thereby improving heat dissipating capabilities and contributing to more stable operation. Reliability can thus be improved.

A second embodiment will now be described.

Figure 2:
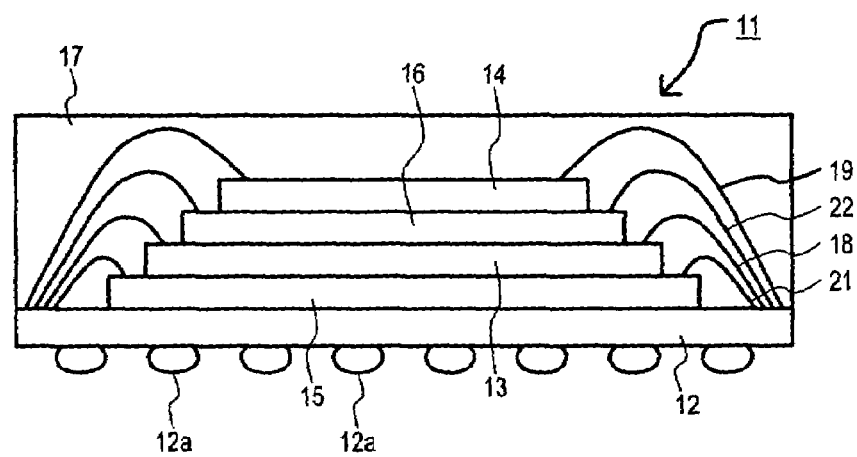
FIG. 2 is a side cross sectional view of a semiconductor device according to a second embodiment of the present invention.

A semiconductor device according to a second embodiment of the present invention is set forth in a side cross sectional view in FIG. 2, and designated by the general reference character 11.

A major difference between a semiconductor device 11 according to a second embodiment, and that of the first embodiment, can be that one more heat transmitting conductive plate 5 can be added and interposed between a lower layer semiconductor chip and a substrate.

A semiconductor device 11 according to a second embodiment can otherwise have a substantially identical structure as a first embodiment. Thus, the description of like components and arrangements will be omitted.

Referring to FIG. 2, a semiconductor device 11 according to a second embodiment can include two semiconductor chips vertically mounted thereto. In particular, a semiconductor device 11 can include a substrate 12 in which ball-like bumps (two of which are shown as 12a) are formed into a grid-like pattern to provide external connection electrodes, a lower layer semiconductor chip (first semiconductor chip) 13 on which a digital circuit can be formed, and an upper layer semiconductor chip (second semiconductor chip) 14 on which an analog circuit can be formed. Circuit faces for both a lower layer semiconductor chip 13 and upper layer semiconductor chip 14 can be arranged upward (toward the top of the figure in FIG. 2).

Further, a heat transmitting conductive plate (heat transmitting conductor) 15, which may be formed from aluminum for example, can be interposed between a substrate 12 and a lower layer semiconductor chip 13. Further, a heat transmitting conductive plate (heat transmitting conductor) 16, which may be formed from aluminum for example, can be interposed between a lower layer semiconductor chip 13 and an upper layer semiconductor chip 14.

A mold resin 17 can seal a lower layer semiconductor chip 13, an upper layer semiconductor chip 14, and other structures.

In the second embodiment semiconductor device 11, a lower semiconductor chip 13 and upper layer semiconductor chip 14 can be connected to a substrate 12 by bonding wires 18 and 19, respectively. Still further, heat transmitting conductive plates 15 and 16 can be connected to a substrate 12 by at least one bonding wire 21 and 22, respectively. More particularly, heat transmitting conductive plates (15 and 16) can be maintained at a static (e.g., ground) potential through bonding wires (21 and 22) being kept at the static (e.g., ground) potential.

In the particular embodiment of FIG. 2, items have increasing sizes according to the following order: upper layer semiconductor chip 14, heat transmitting conductive plate 16, lower layer semiconductor chip 13, and heat transmitting conductive plate 15.

The operation of a semiconductor device according to a second embodiment will now be described.

As noted above, a heat transmitting conductive plate 16, interposed between an upper layer semiconductor chip 14 and a lower layer semiconductor chip 13, can be connected to a ground wiring of a substrate 12 by way of at least one bonding wire 22.

Accordingly, a heat transmitting conductive plate 16 can be maintained at a ground potential, and thus can block the propagation of noise between a lower layer semiconductor chip 13 and an upper layer semiconductor chip 14. For example, noise emitted from a digital circuit in a lower layer semiconductor chip 13 traveling toward an analog circuit in an upper layer semiconductor chip 14 can be blocked by heat transmitting conductive plate 16. Noise can thus be prevented from affecting a signal in an analog circuit of upper layer semiconductor chip 14.

Similarly, noise emitted from an analog circuit in an upper lower layer semiconductor chip 14 traveling toward a digital circuit in a lower layer semiconductor chip 13 can be blocked by heat transmitting conductive plate 16. Noise can thus be prevented from affecting a signal in a digital circuit of a lower layer semiconductor chip 13.

In this way, malfunctions due to the addition of noise to a signal in an analog circuit of an upper layer semiconductor device 4, and inversions and/or delays of signals due to noise in a digital circuit of a lower layer semiconductor device 3, can be avoided.

As also noted above, a heat transmitting conductive plate 15, interposed between a lower layer semiconductor chip 13 and a substrate 12, can also be connected to a ground wiring of a substrate 12 by way of at least one bonding wire 21.

Accordingly, a heat transmitting conductive plate 15 can be maintained at a ground potential, and thus can block the propagation of noise between a substrate 12 and a lower layer semiconductor chip 13.

For example, noise may be added to a signal wiring of a substrate 12 and emitted toward a digital circuit in a lower layer semiconductor chip 13. Such noise can be blocked by heat transmitting conductive plate 15. Noise can thus be prevented from affecting a signal in a digital circuit of a lower layer semiconductor chip 13.

Referring still to FIG. 2, heat generated in a substrate 12 can be transmitted through contact points with a heat transmitting conductive plate 15, and dissipated by the heat transmitting conductive plate 15. Further, heat generated in a lower layer semiconductor chip 13 can be transmitted through contact points with a heat transmitting conductive plates 15 and 16, and dissipated therefrom. Still further, heat generated in an upper layer semiconductor chip 14 can be transmitted through contact points with a heat transmitting conductive plate 16, and dissipated therefrom.

The above arrangement can reduce thermal resistance from lower and upper layer semiconductor devices 13 and 14 to an external surface (package surface) of mold resin 17. Further, such an arrangement can accelerate the dissipation of heat from substrate 12.

Thus, a structure according to a second embodiment can provide substantially the same effects as the first embodiment.

In addition, a second embodiment may provide even greater reductions in the adverse effects of noise, as heat transmitting conductive plate 15 can be interposed between a substrate 12 and a lower layer semiconductor chip 13. This can improve reliability even further. In addition, as noted above, heat transmitting conductive plate 15 can function as a heat dissipating plate for a lower layer semiconductor chip 13 and a substrate 12. Therefore, heat dissipating capability can be improved beyond that of a first embodiment, contributing to even more stable operation.

Figure 3:
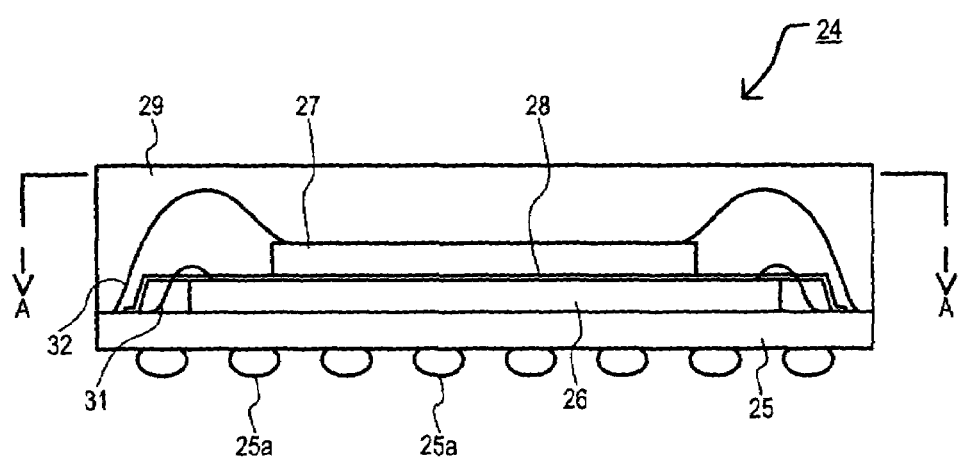
FIG. 3 is a side cross sectional view of a semiconductor device according to a third embodiment of the present invention.
Figure 4:
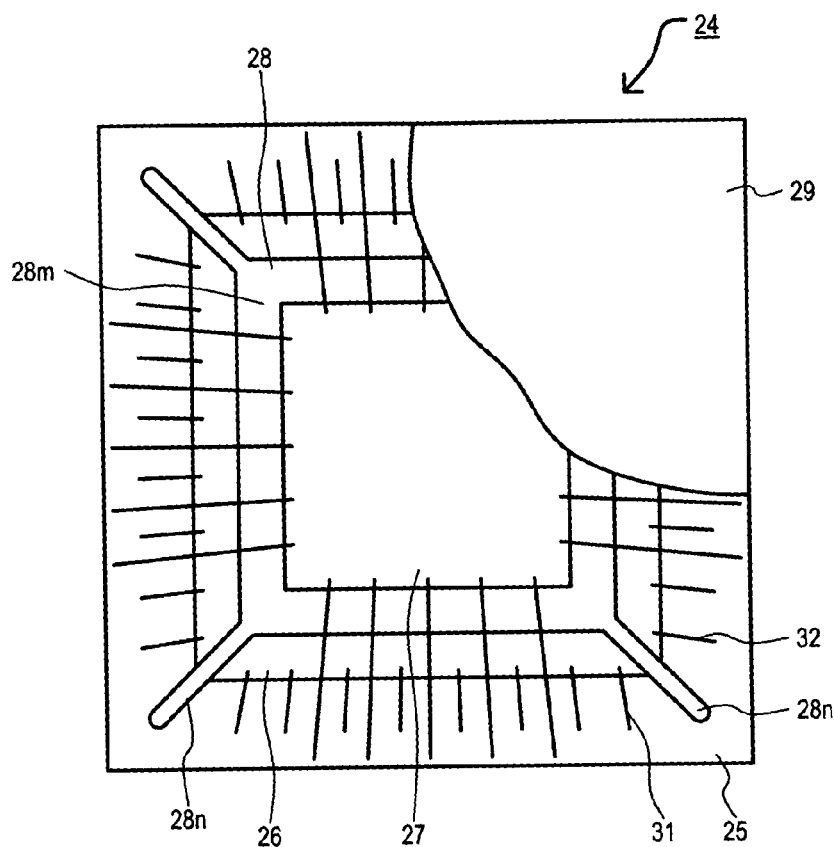
FIG. 4 is a partially cut away top plan view of a semiconductor device taken along the direction indicated by line A-A of FIG. 3.
Figure 5:
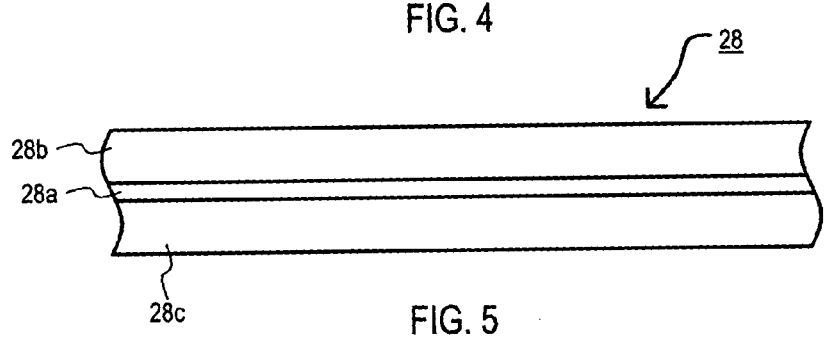
FIG. 5 is a side cross sectional view of a heat transmitting conductive sheet that can be used in a third embodiment of the present invention.

A third embodiment will now be described with reference to FIGS. 3, 4 and 5. FIG. 3 is a side view of a semiconductor device according to a third embodiment. FIG. 4 is a top plan view of a semiconductor device according to a third embodiment in which part of a mold resin is shown cut away. The view of FIG. 4 is from the direction indicated by line A-A of FIG. 3. FIG. 5 is a side cross sectional view of a heat transmitting conductive sheet that may be utilized in a third embodiment.

Referring now to FIG. 3, a semiconductor device according to a third embodiment is set forth in a side view and designated by the general reference character 24. A major difference between a semiconductor device 24 according to a third embodiment, and that of the first embodiment, can be that a heat transmitting conductive sheet is utilized instead of a heat transmitting conductive plate.

A semiconductor device according to a third embodiment can otherwise have a substantially identical structure as a first embodiment, thus the description of like components and arrangements will be omitted.

Referring to FIGS. 3 and 4, a semiconductor device 24 according to a third embodiment can include two semiconductor chips vertically mounted thereto. In particular, a semiconductor device 24 can include a substrate 25 in which ball-like bumps (two of which are shown as 25a) are formed into a grid-like pattern to provide external connection electrodes, a lower layer semiconductor chip (first semiconductor chip) 26 on which a digital circuit can be formed, and an upper layer semiconductor chip (second semiconductor chip) 27 on which an analog circuit can be formed. Circuit faces for both a lower layer semiconductor chip 26 and upper layer semiconductor chip 27 can be arranged to face upward (toward the top of the figure in FIG. 3).

A heat transmitting conductive sheet (heat transmitting conductor) 28 can be interposed between a lower layer semiconductor chip 26 and an upper layer semiconductor chip 27. The semiconductor device 24 can be sealed with a mold resin 29.

Referring to FIG. 5, a heat transmitting conductive sheet 28 can be a flexible sheet-like member that includes a conductive shield layer 28a sandwiched between insulating layers 28b and 28c. A conductive shield layer 28a can include copper, and more particularly may be a copper foil. Insulating layers (28b and 28c) can be formed from polyimide, or the like.

As shown in FIG. 4, a heat transmitting conductive sheet 28 can include a substantially rectangular shield portion 28m that is interposed between a lower layer semiconductor chip 26 and an upper layer semiconductor chip 27. Heat transmitting conductive sheet 28 can also include lead portions (two of which are shown as 28n), which protrude from the four corners of rectangular shield portion 28m, and can be connected with a ground wiring of substrate 25.

In the arrangement of FIGS. 3 and 4, lower layer semiconductor chip 25 and upper lower layer semiconductor chip 27 can be electrically connected to a substrate 25 through bonding wires 31 and 32, respectively.

Heat transmitting conductive sheet 28 can be connected to a ground wiring of a substrate 25 through a lead portion (e.g., 28n), and thus can be kept at a static (e.g., ground) potential.

In the third embodiment shown, a shield portion 28m of a heat transmitting conductive sheet 28 can be smaller in size than a lower level semiconductor chip 26, and larger in size than an upper level semiconductor chip 27.

The operation of a semiconductor device 24 according to a third embodiment will now be described.

As noted above, a shield portion 28m of a heat transmitting conductive sheet 28 can be interposed between a lower layer semiconductor chip 26 and an upper layer semiconductor chip 27. Shield portion 28m can be connected to a ground wiring of substrate 25 through lead portions (28n).

Accordingly, a shield portion 28m can be maintained at a ground potential, and thus block the propagation of noise between a lower layer semiconductor chip 26 and an upper layer semiconductor chip 27.

For example, noise emitted from a digital circuit in a lower layer semiconductor chip 26 and traveling toward an analog circuit in upper layer semiconductor chip 27 can be blocked by shield portion 28m. Noise can thus be prevented from affecting a signal in an analog circuit of an upper layer semiconductor chip 27.

Similarly, noise emitted from an analog circuit of upper layer semiconductor chip 27 traveling toward a digital circuit in a lower layer semiconductor chip 26 can also be blocked by shield portion 28m. As a result, noise may not adversely affect signals of a digital circuit in lower layer semiconductor chip 26.

In this way, malfunctions due to the addition of noise to a signal in an analog circuit of an upper layer semiconductor chip 27 can be avoided. Similarly, inversions and/or delays of signals due to noise in a digital circuit of a lower layer semiconductor chip 26 can likewise be avoided.

Still further, heat generated in a lower layer semiconductor chip 26 and an upper layer semiconductor chip 27 can be transmitted through contact points with shield portion 28m and dissipated therefrom. This can reduce thermal resistance of a lower layer semiconductor chip 26 and upper layer semiconductor chip 27 to an external surface (package surface) of mold resin 29.

Thus, a structure according to a third embodiment can provide substantially the same effects as the first embodiment.

Figure 6:
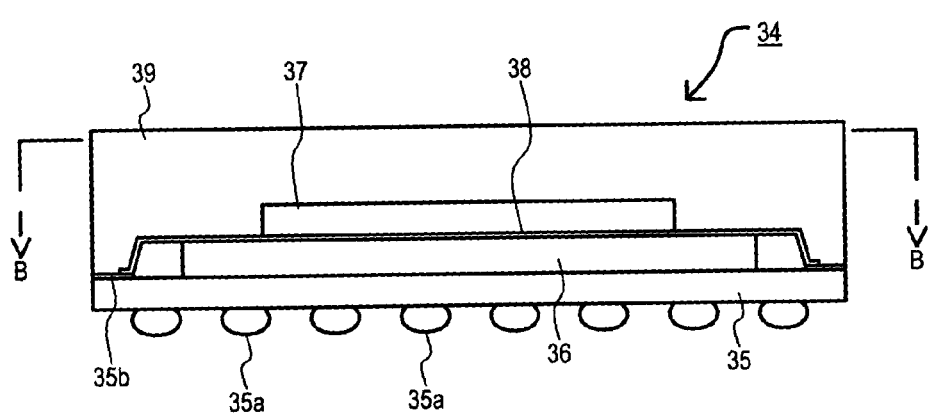
FIG. 6 is a side cross sectional view of a semiconductor device according to a fourth embodiment of the present invention.
Figure 7:
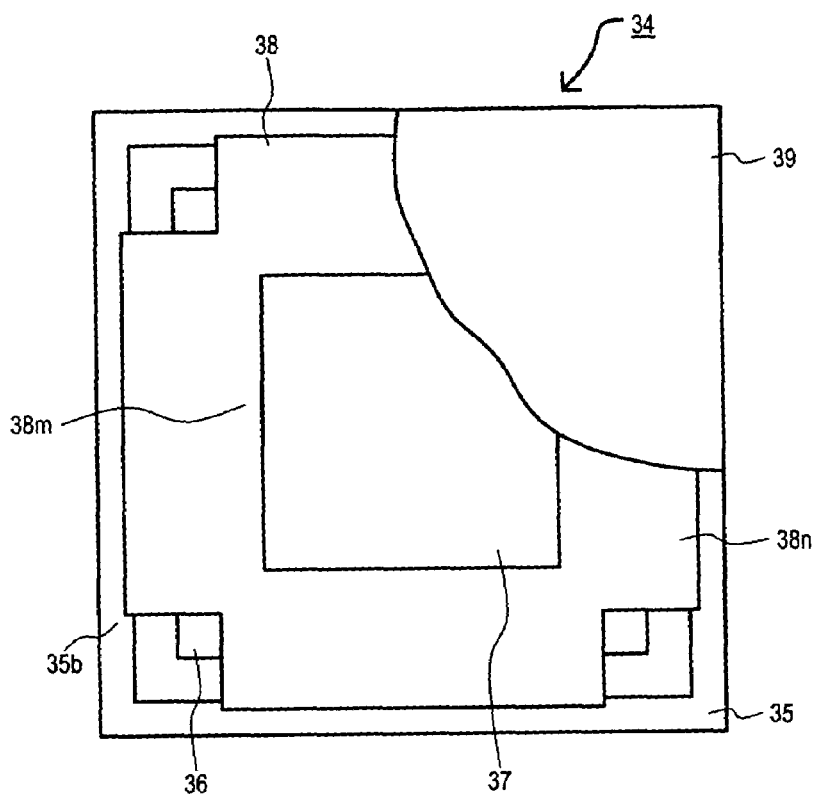
FIG. 7 is a partially cut away top plan view of a semiconductor device taken along the direction indicated by line B-B of FIG. 6.
Figure 8:
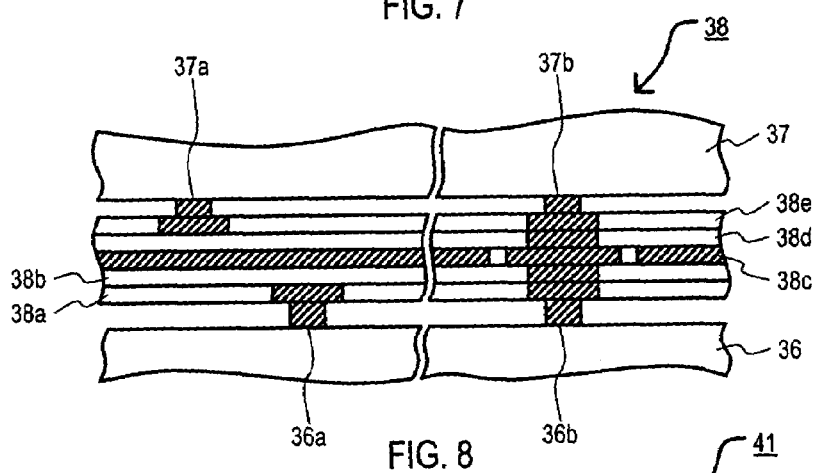
FIG. 8 is a side cross sectional view of a heat transmitting conductive sheet that can be used in a fourth embodiment of the present invention, as well as a connection arrangement between a lower layer semiconductor chip and a upper layer semiconductor chip through the heat transmitting conductive sheet.

A fourth embodiment will now be described with reference to FIGS. 6, 7 and 8. FIG. 6 is a side view of a semiconductor device according to a fourth embodiment. FIG. 7 is a top plan view of a semiconductor device according to a fourth embodiment in which part of a mold resin is shown cut away. The view of FIG. 7 is from the direction indicated by line B-B of FIG. 6. FIG. 8 is a side cross sectional view showing a heat transmitting conductive sheet that may be utilized in a third embodiment, as well as a connection arrangement between a lower layer semiconductor chip and an upper layer semiconductor chip through such a heat transmitting conductive sheet.

Referring now to FIG. 6, a semiconductor device according to a fourth embodiment is set forth in a side view and designated by the general reference character 34. A major difference between a semiconductor device 34 according to a fourth embodiment and that of the third embodiment is that a lower layer semiconductor chip and upper layer semiconductor chip can be arranged with circuit containing faces that oppose one another.

A semiconductor device according to a fourth embodiment can otherwise have a substantially identical structure as a third embodiment, thus the description of like components and arrangements will be omitted.

Referring to FIGS. 6 and 7, a semiconductor device 34 according to a third embodiment can include two semiconductor chips vertically mounted thereto. In particular, a semiconductor device 34 can include a substrate 35 in which ball-like bumps (two of which are shown as 35a) are formed into a grid-like pattern to provide external connection electrodes, a lower layer semiconductor chip (first semiconductor chip) 36 on which a digital circuit can be formed, and an upper layer semiconductor chip (second semiconductor chip) 37 on which an analog circuit can be formed. Circuit faces of a lower layer semiconductor chip 36 and upper layer semiconductor chip 37 can oppose one another.

A heat transmitting conductive sheet (heat transmitting conductor) 38 can be interposed between a lower layer semiconductor chip 36 and an upper layer semiconductor chip 37. The semiconductor device 34 can be sealed with a mold resin 39.

Referring to FIG. 8, a heat transmitting conductive sheet 38 can be a flexible sheet-like member that includes a lower wiring layer 38a to which a lower semiconductor chip 36 can be connected, an insulating layer 38b, a shield layer 38c, an insulating layer 38d, and an upper wiring layer 38e to which an upper layer semiconductor chip 37 can be connected. The layers of heat transmitting conductive sheet 38 can be layered in the above order.

As shown in FIG. 7, a heat transmitting conductive sheet 38 can include a substantially rectangular shield portion 38m that is interposed between a lower layer semiconductor chip 36 and an upper layer semiconductor chip 37. Heat transmitting conductive sheet 38 can also include lead portions (one of which is shown as 38n), which extend from the four edges of rectangular shield portion 38m, and are connected with a wiring of substrate 35.

A lower layer semiconductor chip 36 and upper layer semiconductor chip 37 can be electrically connected to one another through a shield portion 38m of a heat transmitting conductive sheet 38, and may be electrically connected to a substrate 35 through lead portions 38n.

To elaborate, referring back to FIG. 8, bumps 36a and 36b of a lower layer semiconductor chip 36 can be connected to corresponding portions of lower wiring layer 38a. In addition, bumps 37a and 37b of upper layer semiconductor chip 37 can be connected to corresponding portions of upper wiring layer 38e.

A right portion of FIG. 8 shows one example of how a lower layer semiconductor chip 36 can be connected to an upper layer semiconductor chip 37 through a shield layer 38c. Corresponding bumps 36b and 37b may have a same position with respect to a direction perpendicular to circuit forming faces of lower and upper semiconductor chips (36 and 37). Such corresponding bumps (36b and 37b) can be connected to one another in such a direction by corresponding portion of a lower wiring layer 38a, a conductive portion formed in the insulating layer 38b, a portion of shield layer 38c immediately above, which may be surrounded by a ring-like insulating layer, a conductive portion formed in the insulating layer 38d immediately above, and a corresponding portion of upper wiring layer 38e. Thus, a lower layer semiconductor chip 36 and an upper layer semiconductor chip 37 can be connected to one another at this point.

A heat transmitting conducting sheet 38 can be connected to a ground wiring 35b of a substrate 35 through a lead portion (e.g., 38n), and thus can be kept at a ground potential. In the embodiment shown, a ground wiring 35b can be formed along an entire perimeter of a top face of substrate 35.

A shield portion 38m of a heat transmitting conductive sheet 38 can be smaller in size than a lower level semiconductor chip 36, and larger in size than an upper level semiconductor chip 37.

The operation of a semiconductor device 34 according to a fourth embodiment will now be described.

As noted above, a shield portion 38m of a heat transmitting conductive sheet 38 can be interposed between a lower layer semiconductor chip 36 and an upper layer semiconductor chip 37. The shield portion 38m can also be connected to a ground wiring 35b of a substrate 35 through one or more lead portions 38n.

Accordingly, a shield portion 38m can be maintained at a ground potential, and thus block the propagation of noise between a lower layer semiconductor chip 36 and an upper layer semiconductor chip 37.

Heat generated in a lower layer semiconductor chip 36 and an upper layer semiconductor chip 37 can be transmitted through contact points with shield portion 38m and dissipated from the shield portion 38m, lead portions 38n, and ground wiring 35b. This can reduce thermal resistance of a lower layer semiconductor chip 36 and upper layer semiconductor chip 37 to an external surface (package surface) of mold resin 39.

Thus, a structure according to a fourth embodiment can provide substantially the same effects as the third embodiment.

In addition, because a ground wiring 35b can be formed along an entire perimeter of a top face of substrate 35, heat generated in a lower layer semiconductor chip 36 and an upper layer semiconductor chip 37 can be transmitted to a ground wiring 35b and dissipated with a higher degree of certainty.

Furthermore, an electrical connection between a lower layer semiconductor chip 36 and an upper layer semiconductor chip 37 through a shield portion 38m of heat transmitting conductive sheet 38 can increase the degree of freedom in designing a circuit.

For example, the increased degree of freedom can allow a designer to choose where to place an electrode with fewer restrictions. More specifically, it may be unnecessary to place corresponding bumps of a lower layer semiconductor chip 36 and an upper layer semiconductor chip 37 at a same position with respect to a direction perpendicular to the circuit forming faces, as a heat transmitting conductive sheet 38 may provide an electrical connection path that travels in a lateral direction as well as a vertical direction.

Moreover, a step of wire-bonding a lower layer semiconductor chip 36 and an upper layer semiconductor chip 37 to a substrate 35 separately can be omitted, as the lower layer semiconductor chip 36 and an upper layer semiconductor chip 37 can be connected to a substrate 35 through lead portions 38n.

Figure 9:
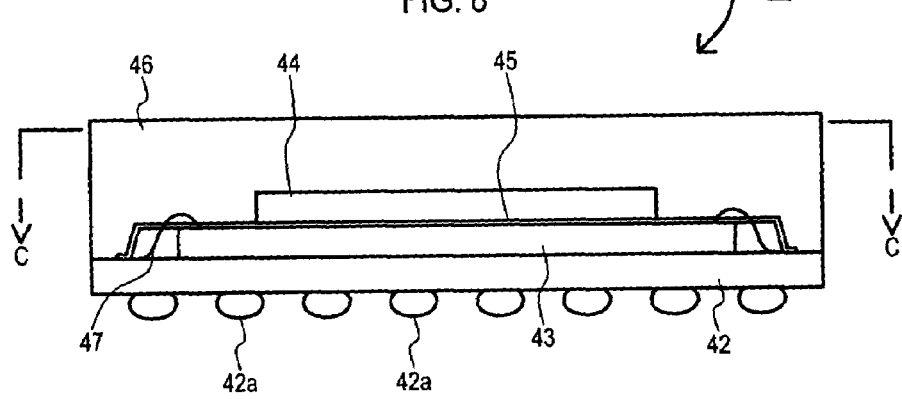
FIG. 9 is a side cross sectional view of a semiconductor device according to a fifth embodiment of the present invention.
Figure 10:
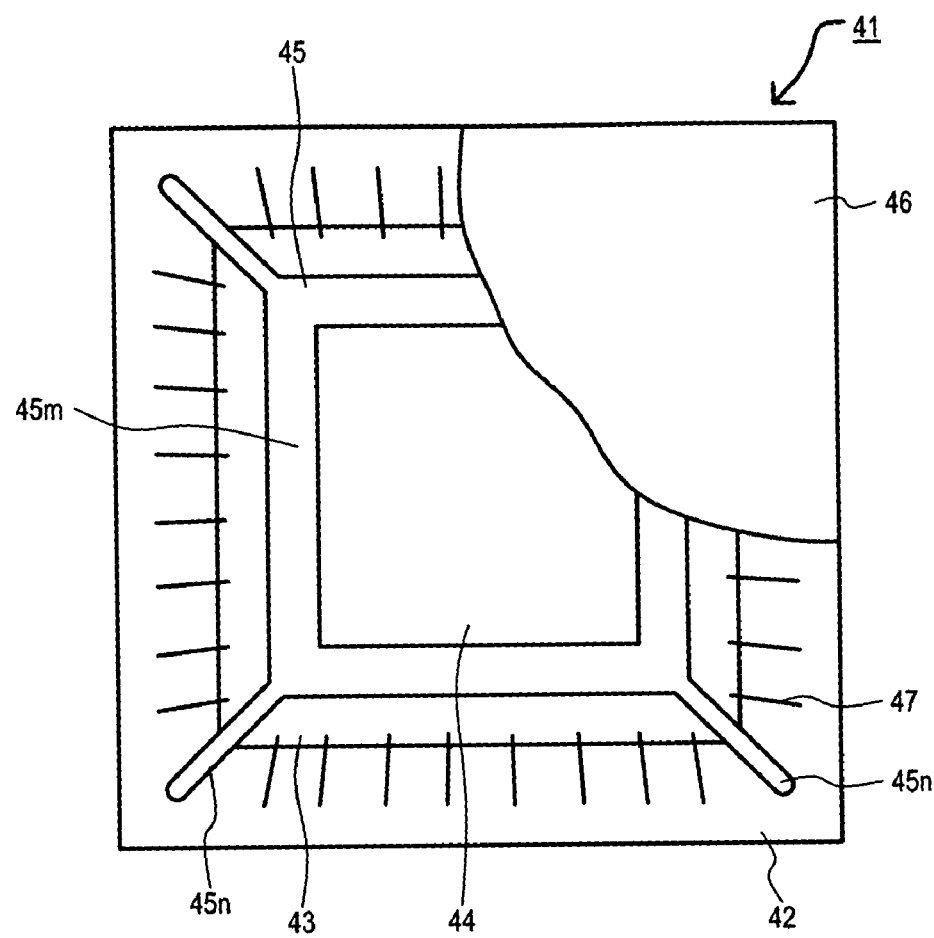
FIG. 10 is a partially cut away top plan view of a semiconductor device taken along the direction indicated by line C-C of FIG. 9.
Figure 11:
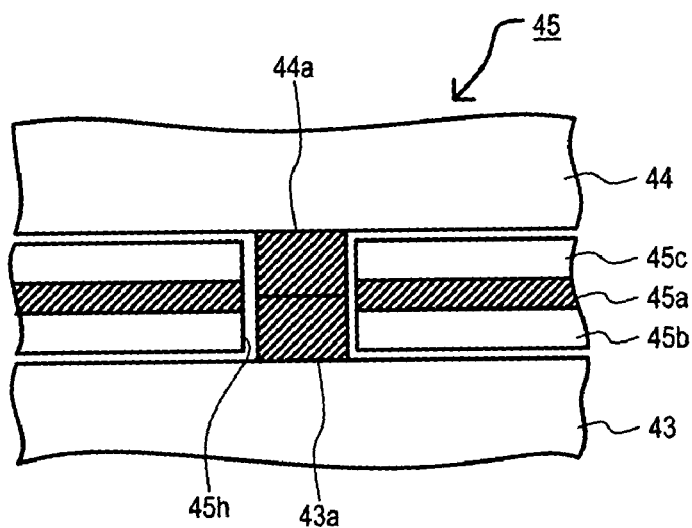
FIG. 11 is a side cross sectional view of a heat transmitting conductive sheet that can be used in a fifth embodiment of the present invention, as well as a connection arrangement between a lower layer semiconductor chip and a upper layer semiconductor chip through the heat transmitting conductive sheet.

A fifth embodiment will now be described with reference to FIGS. 9, 10 and 11. FIG. 9 is a side view of a semiconductor device according to a fifth embodiment. FIG. 10 is a top plan view of a semiconductor device according to a fifth embodiment in which part of a mold resin is shown cut away. The view of FIG. 10 is from the direction indicated by line C-C of FIG. 9. FIG. 11 is a side cross sectional view showing a heat transmitting conductive sheet that may be utilized in a fourth embodiment, as well as a connection arrangement between a lower layer semiconductor chip and an upper layer semiconductor chip through such a heat transmitting conductive sheet.

Referring now to FIG. 9, a semiconductor device according to a fifth embodiment is set forth in a side view and designated by the general reference character 41. A major difference between a semiconductor device 41 according to a fifth embodiment and that of the fourth embodiment is that a structure of heat transmitting conductive sheet can be changed so that bumps of a lower layer semiconductor chip and upper layer semiconductor chip can be directly connected with one another. Further, a substrate and a lower layer semiconductor chip can be connected to one another by wiring bonding.

A semiconductor device according to a firth embodiment can otherwise have a substantially identical structure as a third embodiment, thus the description of like components and arrangements will be omitted.

Referring to FIGS. 9 and 10, a semiconductor device 41 according to a fifth embodiment can include two semiconductor chips vertically mounted thereto. In particular, a semiconductor device 41 can include a substrate 42 in which ball-like bumps (two of which are shown as 42a) are formed into a grid-like pattern to provide external connection electrodes, a lower layer semiconductor chip (first semiconductor chip) 43 on which a digital circuit can be formed, and an upper layer semiconductor chip (second semiconductor chip) 44 on which an analog circuit can be formed. Circuit faces of a lower layer semiconductor chip 43 and upper layer semiconductor chip 44 can oppose one another.

A heat transmitting conductive sheet (heat transmitting conductor) 45 can be interposed between a lower layer semiconductor chip 43 and an upper layer semiconductor chip 44. The semiconductor device 41 can be sealed with a mold resin 46.

Referring to FIG. 11, a heat transmitting conductive sheet 45 can be a flexible sheet-like member that includes a shield layer 45a, which can be sandwiched between insulating layers 45b and 45c to form a laminate structure.

As shown in FIG. 10, a heat transmitting conductive sheet 45 can include a substantially rectangular shield portion 45m that is interposed between a lower layer semiconductor chip 43 and an upper layer semiconductor chip 44. Heat transmitting conductive sheet 45 can also include lead portions (two of which is shown as 45n), which protrude from the four corners of the rectangular shield portion 45m, and are connected with a ground wiring of substrate 42.

Referring back to FIG. 11, a lower layer semiconductor chip 43 and upper layer semiconductor chip 44 can be connected to one another with corresponding bumps 43a and 44a. At a location where corresponding bumps 43a and 44a are to be connected, an insertion hole 45h can be formed in a heat transmitting conductive sheet 45 into which corresponding bumps 43a and 44a can be inserted.

In this way, a lower layer semiconductor chip 43 and upper layer semiconductor chip 44 can be electrically connected to one another through a shield portion 45m of a heat transmitting conductive sheet 45 at locations where insertion holes (e.g., 45h) are formed.

A lower layer semiconductor chip 43 can be connected to a substrate through bonding wires 47.

A heat transmitting conducting sheet 45 can be connected to a ground wiring of substrate 42 through lead portions (e.g., 45n), and thus can be kept at a ground potential.

In the particular arrangement of FIGS. 9-11, a shield portion 45m of a heat transmitting conductive sheet 45 can be smaller in size than a lower level semiconductor chip 43, and larger in size than an upper level semiconductor chip 44.

The operation of a semiconductor device 41 according to a fifth embodiment will now be described.

As noted above, a shield portion 45m of a heat transmitting conductive sheet 45 can be interposed between a lower layer semiconductor chip 43 and an upper layer semiconductor chip 44, and shield portion 45m can be connected to a ground wiring of a substrate 42 through one or more lead portions 45n.

Accordingly, a shield portion 45m can be maintained at a ground potential, and thus block the propagation of noise between a lower layer semiconductor chip 43 and an upper layer semiconductor chip 44.

Heat generated in a lower layer semiconductor chip 43 and an upper layer semiconductor chip 44 can be transmitted through contact points with heat transmitting conductive sheet 45 and dissipated therefrom. This can reduce thermal resistance of a lower layer semiconductor chip 43 and upper layer semiconductor chip 44 to an external surface (package surface) of mold resin 46.

Thus, a structure according to a fifth embodiment can provide substantially the same effects as the fourth embodiment.

Further, a manufacturing cost for a device according to a fifth embodiment can be relatively inexpensive as the structure of a heat transmitting conductive sheet 45 can be simplified.

Figure 12:
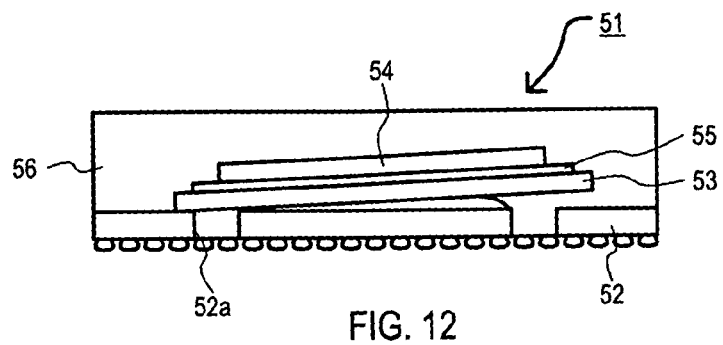
FIG. 12 is a side cross sectional view of a semiconductor device that can be manufactured according to a sixth embodiment of the present invention.
Figure 13:
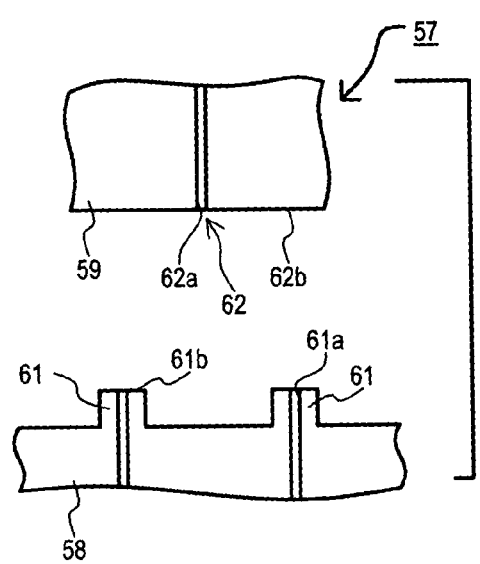
FIG. 13 is cross sectional view of a mounting device that may be utilized in a sixth embodiment of the present invention.
Figure 14:
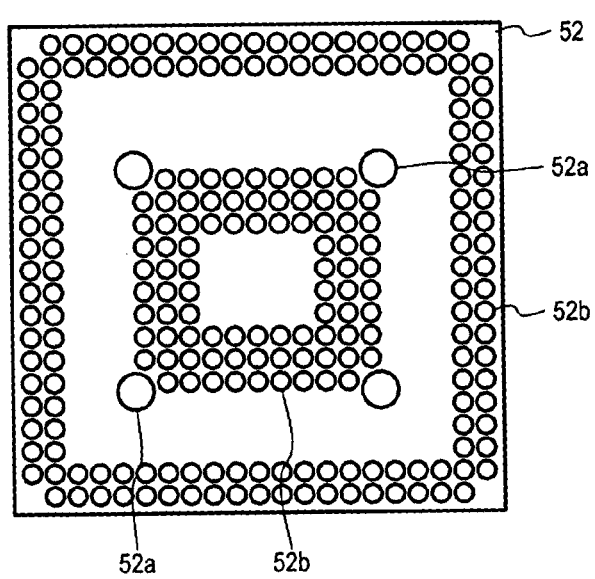
FIG. 14 is bottom plan view of a substrate that can be included in a semiconductor device manufactured according to a sixth embodiment.
Figure 15:
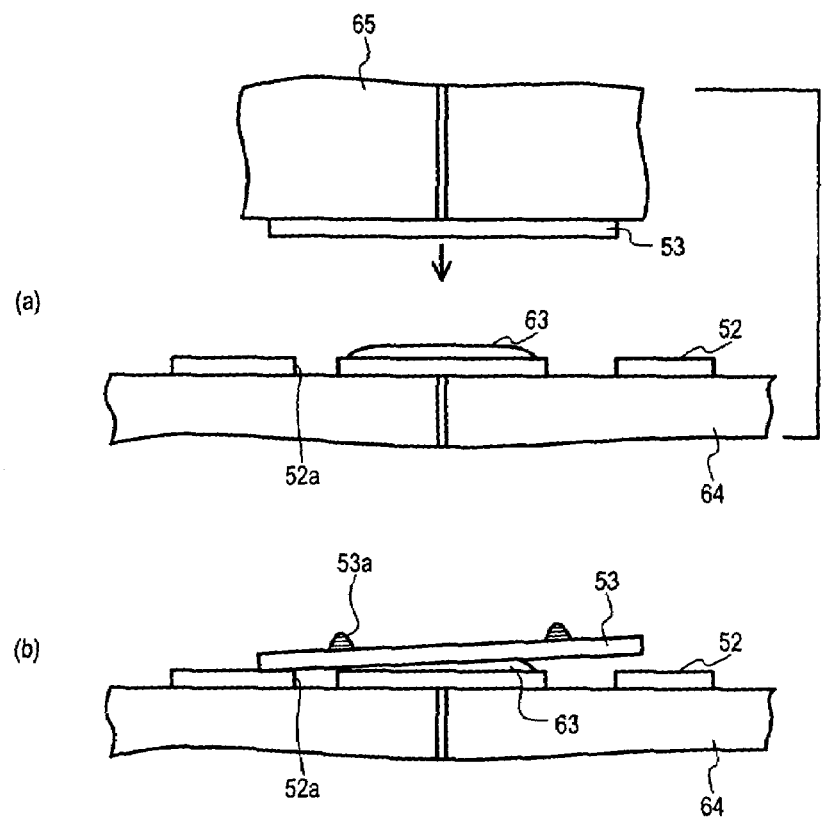
FIGS. 15($a$) and 15($b$) are side cross sectional views illustrating manufacturing steps of a sixth embodiment of the present invention.
Figure 16:
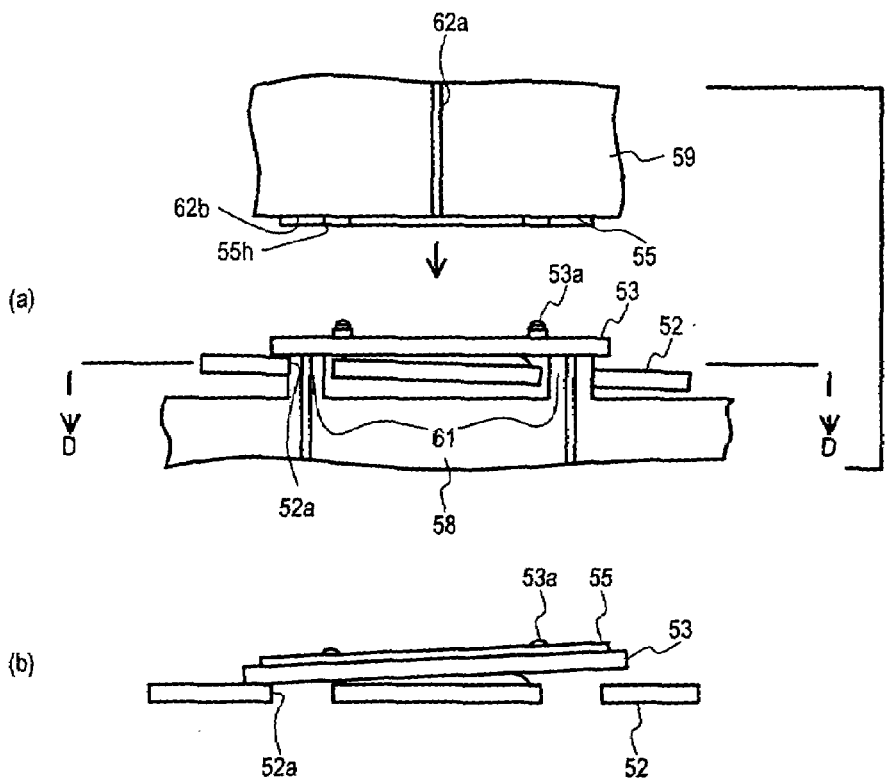
FIGS. 16($a$) and 16($b$) are side cross sectional views illustrating additional manufacturing steps of a sixth embodiment of the present invention.
Figure 17:
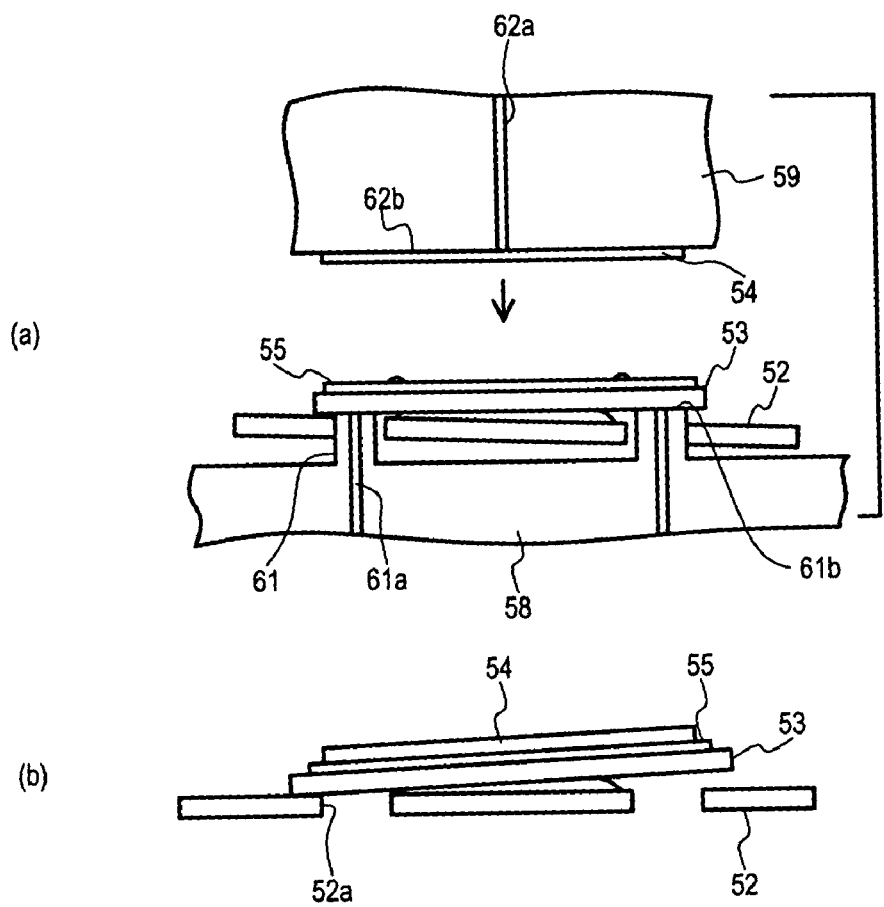
FIGS. 17($a$) and 17($b$) are side cross sectional views illustrating further manufacturing steps of a sixth embodiment of the present invention.
Figure 18:
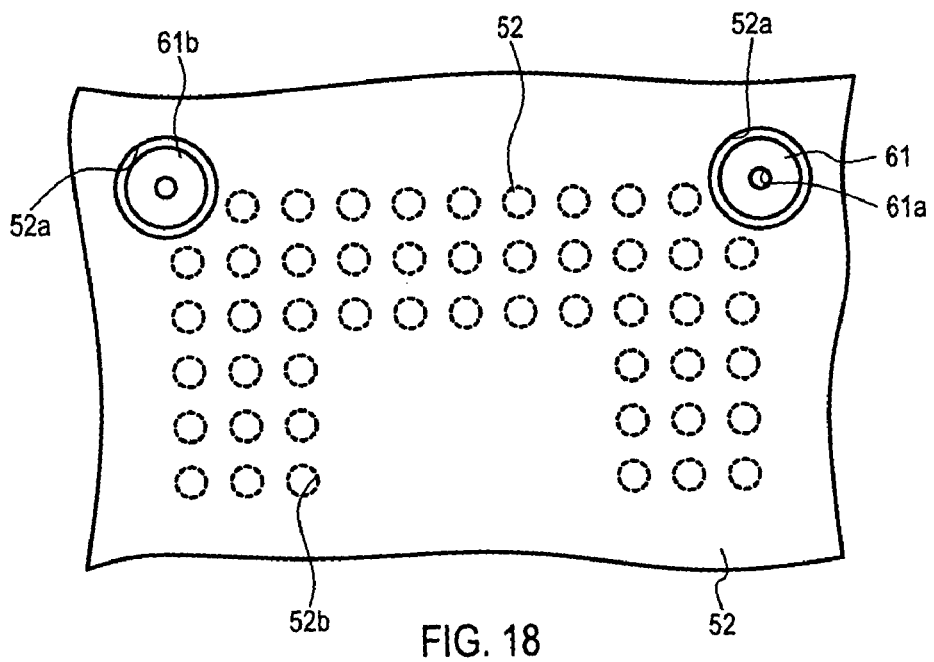
FIG. 18 is top sectional view taken along line D-D of FIG. 16($a$).

A semiconductor device manufacturing method according to a sixth embodiment will now be described with reference to FIGS. 12 to 18. FIG. 12 is a side cross sectional view of a semiconductor device that can be manufactured according to a sixth embodiment of the present invention. FIG. 13 is a diagram showing a mounting device structure that can be used in a manufacturing method according to the sixth embodiment. FIG. 14 is a bottom plan view showing the structure of a substrate for a semiconductor device manufactured according to the sixth embodiment. FIGS. 15(a) to 17(b) are a series of side cross sectional views showing a method of manufacturing a semiconductor device according to a sixth embodiment. FIG. 18 is a sectional view taken along line D-D of FIG. 16(a).

A semiconductor device manufacturing method according to a sixth embodiment is suitable for forming a chip on chip (COC) semiconductor device, like that described in the fifth embodiment. It will be recalled that in the fifth embodiment, two semiconductor chips are arranged in vertical direction and mounted on a substrate with their circuit forming faces opposing one another.

Referring to FIG. 12, a semiconductor device 51 manufactured according to a sixth embodiment can include a lower layer semiconductor chip 53 (first semiconductor chip) and an upper layer semiconductor chip 54 (second semiconductor chip) stacked and mounted on a substrate 52. Circuit forming faces of the lower and upper layer semiconductor chips (53 and 54) can oppose one another with a heat transmitting conductive plate or sheet (heat transmitting conductor) 55 interposed therebetween. The semiconductor device 51 can be sealed with a mold resin 56.

It is noted that the very particular example of FIG. 12 illustrates an arrangement in which an adhesive between a lower layer semiconductor chip 53 and a substrate 52 has cured to an uneven thickness. As a result, a lower layer semiconductor chip 53 may be tilted to some degree with respect to a substrate 52. Conventionally, such an arrangement may present manufacturing problems as structures may be subject to uneven mechanical pressure. As but one very particular example, electrodes of the lower layer semiconductor chip 53 situated over a thicker portion of the adhesive may be subject to greater pressure than like electrodes formed over a thinner portion of the adhesive. As a result, active elements or other circuit portions surrounding such electrodes can be damaged during the assembly of the device.

A description will now be made of a mounting device that can be used in a sixth embodiment to join an upper layer semiconductor chip 54 to a lower layer semiconductor chip 53 that is mounted to a substrate 52 with an adhesive, for example.

Referring to FIG. 13, a mounting device is designated by the general reference character 57, and can support a lower layer semiconductor chip 53 mounted on a substrate 52. As one sample, a mounting device 57 can include a mount stage (or parts mount base) 58 and a mount tool (part gripping tool) 59. A mount state 58 can be movable in directions that are orthogonal to one another. A mount tool 59 can grip an upper layer semiconductor chip 54 by vacuum suction to transport such an upper layer semiconductor chip 54 to a point above lower layer semiconductor chip 53. Mount tool 59 can set the upper layer semiconductor chip 54 on the lower layer semiconductor chip 53 to connect the two chips together.

A mount stage 58 can have projecting suction portions (first suction portions) 61 for insertion into holes 52a formed in substrate 52. A suction hole 61a can be formed in each suction portion 61. By operation of a decompressor (not shown, which can be an ejector vacuum pump, for example), outside air can be suctioned along the path of suction holes 61a, and a lower layer semiconductor chip 53 can be held by such suction to a front end face 61b of suction portions 61.

A mount stage 58 can be equipped with a heater (not shown) for heating and curing a thermally curable adhesive. Such an adhesive, for example, can be for bonding a lower layer semiconductor chip 53 to substrate 52.

A mount tool 59 may also have suction portions. These suction portions (second suction portions) are denoted in FIG. 13 by the reference character 62. A suction hole 62a can be formed in each of suction portions 62. By operation of a decompressor (not show), outside air can be suctioned along the path of suction holes 62a, and an upper layer semiconductor chip 54 can be held by such suction to suction face 62b of suction portions 62. In a similar fashion to a mount stage 58, a mount tool 59 can include a built-in heater.

Referring to FIG. 14, in a semiconductor device manufacturing method according to a sixth embodiment, a first step can include preparing a substrate 52. A substrate 52 can include, for example, a wiring board with through holes (two of which are shown as 52a) formed in advance at predetermined locations, and external connection electrodes (two of which are shown as 52b) provided on a bottom face of a substrate 52. Through holes 52a can be circular shape, and projecting suction portions 61 of a mount stage 58 can be inserted into such through holes.

Referring to FIG. 15(a), an adhesive 63 can be applied to a chip mount face of a substrate 52. An adhesive 63 may comprise silver paste, for example.

Referring to FIG. 15(b), thereafter, a lower layer semiconductor chip 53 can be lowered and set on substrate 52. The adhesive 63 can then be cured by heating. In addition, bumps 53a can be formed on lower layer semiconductor chip 53.

In the above described step of mounting a lower layer semiconductor chip 53 onto substrate 52, a conventional mounting device can be used. Such a mounting device can include a mount stage 64 for holding a substrate 52 and a mount tool 65 for holding and lowering a lower layer semiconductor chip 53. In the curing of adhesive 63, a mount stage 64 can be heated by a built-in heater.

Referring to FIG. 16(a) and FIG. 18, a substrate 52 mounted with a lower layer semiconductor chip 53 can be set so that projection portions 61 of mount stage 58 are inserted into through holes 52a of substrate 52. A lower layer semiconductor chip 53 can thus be supported by suction at front end faces 61b of projecting suction portions 61.

At this point, a heat transmitting conductive plate 55 can be held by suction to a suction face 62b of mount tool 59. Heat transmitting conductive plate 55 can have insertion holes 55h formed therein, through which bumps 53a of lower layer semiconductor chip 53 can be inserted.

Referring to FIG. 16(b), heat transmitting conductive plate 55 can be lowered while keeping the heat transmitting conductive plate 55 essentially parallel to lower layer semiconductor chip 53. Heat transmitting conductive plate 55 can thus be set on a lower layer semiconductor chip 53.

Referring now to FIG. 17(a), an upper layer semiconductor chip 54 can be held by suction to a suction face 62b of mount tool 59.

Referring to FIG. 17(b), upper layer semiconductor chip 54 can be lowered while keeping the lower layer semiconductor chip 53, heat transmitting conductive plate 55, and upper layer semiconductor chip 54 essentially in parallel. Upper layer semiconductor chip 54 can thus be set on heat transmitting conductive plate 55 and joined thereto. At the same time, corresponding electrodes of the upper and lower layer semiconductor chips (53 and 54) can be brought into contact with one another, through insertion holes 55h within the heat transmitting conductive plate 55.

The above steps may be followed by a resin sealing step to obtain a semiconductor device 51, like that shown in FIG. 12.

In this way, a semiconductor device 51 can be formed in which active elements or other circuit portions surrounding electrodes are not damaged due to uneven pressure to a circuit forming face of a lower layer semiconductor chip 53.

According to a method of the sixth embodiment, an upper layer semiconductor chip 54 can be brought into contact with a lower layer semiconductor chip 53 on which heat transmitting conductive plate 55 has been placed, while keeping the upper and lower layer semiconductor chips (54 and 53) parallel to each other. This can make contact pressure substantially uniform along points where bumps 53a are formed. Therefore, even when a thickness of an adhesive 63 fluctuates resulting a lower layer semiconductor chip 53 having a tilt with respect to a substrate 52, breakage or damage of a circuit of a lower layer semiconductor chip 53, for example, can be avoided.

Also, a heat transmitting conductive plate 55 can be set on a lower layer semiconductor chip 53 so that a bottom face of the heat transmitting conductive plate 55 and an inside face insertion hole 55h collide against points where bumps 53a are formed. However, even in such arrangements, lopsided pressure is not applied at specific points. Therefore, breakage or damage to a circuit of a lower layer semiconductor chip 53b can be avoided.

Thus, a method according to a sixth embodiment can achieve such advantageous effects, even when a substrate thickness fluctuates. Accordingly, yield and/or reliability can be improved.

Furthermore, according to a method of manufacturing a semiconductor device according to a sixth embodiment, reductions in device size can be achieved due to vertical stacking, malfunctions can be avoided by blocking propagation of noise between a lower layer semiconductor chip 53 and an upper layer semiconductor chip 54, and heat dissipating capabilities can be improved, contributing to a more stable operation. It can thus be possible to manufacture a semiconductor device having a high degree of reliability.

Figure 19:
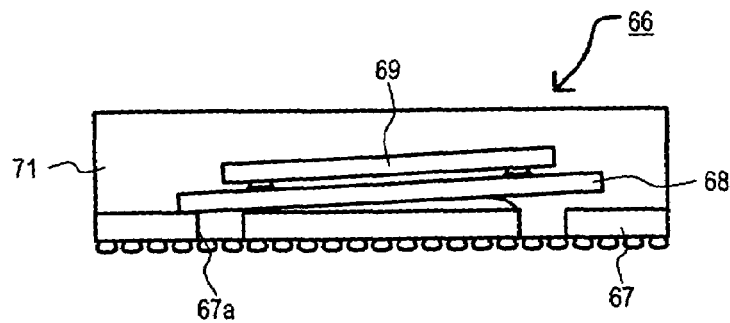
FIG. 19 is a side cross sectional view of a semiconductor device manufactured according to a seventh embodiment of the present invention.
Figure 20:
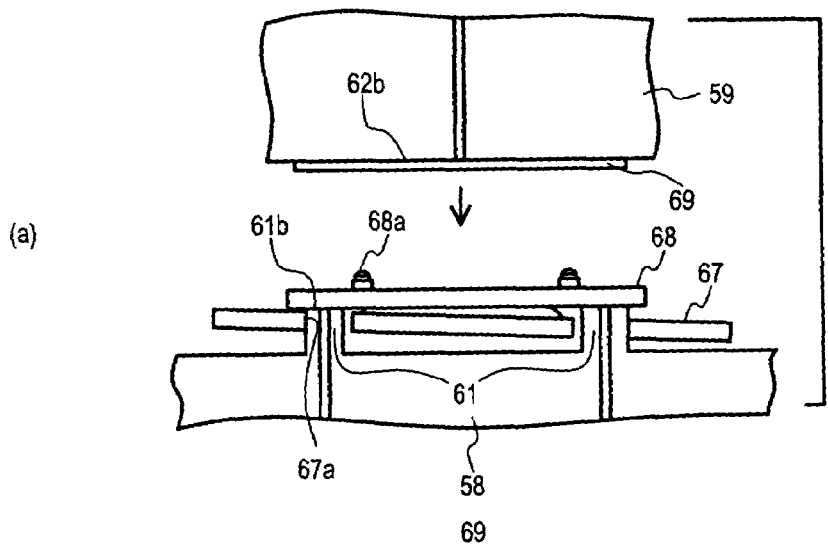
FIGS. 20($a$) and 20($b$) are side cross sectional views illustrating manufacturing steps of a seventh embodiment of the present invention.

A semiconductor device manufacturing method according to a seventh embodiment will now be described with reference to FIGS. 19 to 20(b). FIG. 19 is a side cross sectional view of a semiconductor device that can be manufactured according to a seventh embodiment of the present invention. FIGS. 20(a) to 20(b) are a series of side cross sectional views showing a method of manufacturing a semiconductor device according to a seventh embodiment.

Referring to FIG. 19, a major difference between the seventh embodiment and sixth embodiment is that a step of setting a heat transmitting conductive plate on a lower layer semiconductor chip can be omitted. In contrast, in the sixth embodiment a heat transmitting conductive plate can be interposed between a lower layer semiconductor chip and an upper layer semiconductor chip.

The remaining parts of a method and resulting structure according to a seventh embodiment can be essentially the same as the sixth embodiment, thus the description of like components and arrangements will be omitted.

Referring to FIG. 19, a semiconductor device 66 manufactured according to a seventh embodiment can include a lower layer semiconductor chip 68 (first semiconductor chip) and an upper layer semiconductor chip 69 (second semiconductor chip) stacked and mounted on a substrate 67. Circuit forming faces of the lower and upper layer semiconductor chips (68 and 69) can oppose one another. The semiconductor device 66 can be sealed with a mold resin 71.

Referring to FIG. 20(a), in a semiconductor device manufacturing method according to a seventh embodiment, a substrate 67 mounted with a lower layer semiconductor chip 68 can be set so that projection suction portions 61 of mount stage 58 are inserted into through holes 67a of substrate 67. A lower layer semiconductor chip 68 can thus be supported by suction at front end faces 61b of projecting suction portions 61.

At this point, an upper layer semiconductor chip 69 can be held by suction to a suction face 62b of mount tool 59.

Referring to FIG. 20(b), upper layer semiconductor chip 69 can be lowered while keeping the lower layer semiconductor chip 68 and upper layer semiconductor chip 69 essentially in parallel. Electrodes of the upper and lower layer semiconductor chips (69 and 68) can be brought into contact with one another. Upper layer semiconductor chip 69 can be pressed against lower layer semiconductor chip 68 to join the chips by a hot press fit.

At this point, a mount stage 58 and mount tool 59 can be heated with built-in heaters to a predetermined temperature. In this state, upper layer semiconductor chip 69 and lower layer semiconductor chip 68 can be press fit to each other at points where bumps 68a are formed.

The above steps may be followed by a resin sealing step to obtain a semiconductor device 66, like that shown in FIG. 19.

In this way, a semiconductor device 66 can be formed in which active elements or other circuit portions surrounding electrodes are not damaged due to uneven pressure to a circuit forming face of a lower layer semiconductor chip 68.

According to a method of manufacture of the seventh embodiment, an upper layer semiconductor chip 69 can be brought into contact with a lower layer semiconductor chip 68, while keeping the upper and lower layer semiconductor chips (68 and 69) parallel to each other. This can make contact pressure substantially uniform along points where bumps 68a are formed. Therefore, even when a thickness of an adhesive fluctuates, breakage or damage of a circuit of a lower layer semiconductor chip 68, for example, can be avoided.

These advantageous effects can be achieved to the same degree, even when a substrate thickness fluctuates. Accordingly, yield and/or reliability can be improved.

Detailed descriptions have been given in the above embodiments of the present invention with reference to the drawings. However, the present invention should not be construed as limited to such particular structures, and could be subject to various changes or modifications that do not depart from the spirit of the present invention.

For instance, although the above embodiments have described structures in which a lower layer semiconductor chip and upper layer semiconductor chip are arranged in a vertical direction, three or more semiconductor chips can be vertically stacked instead. In such a case, a heat transmitting conductive plate or heat transmitting conductive sheet can be interposed between each pair of adjacent semiconductor chips. Alternatively, a heat transmitting conductive plate or heat transmitting conductive sheet can be interposed between each pair of adjacent semiconductor chips, except adjacent semiconductor chips that both have digital circuits formed thereon.

The cases above have shown examples in which a semiconductor chip and heat transmitting conductive plate (or sheet or layer) on a upper portion have a smaller size than a semiconductor chip and/or heat transmitting conductive plate (or sheet or layer) on a lower portion. However, the present invention is not limited to such an arrangement. As but one example, a semiconductor chip of an upper portion can be larger in size, if necessary, than structures of a lower portion.

The cases above have shown examples in which a digital circuit is formed on a lower semiconductor chip and an analog circuit is formed on an upper semiconductor chip. Alternatively, an analog circuit may be formed on a lower layer semiconductor chip while a digital circuit is formed on a higher layer semiconductor chip, or upper and lower semiconductor chips may both have digital circuits, or may both have analog circuits.

Placement of bond wires according to the present invention could also be subject to variation. As but two examples, in the case of the first embodiment, bonding of bonding wires 7, 8, and 9 can be conducted separately after lower semiconductor chip 3 is mounted, after heat transmitting conductive plate 5 is mounted, and upper layer semiconductor chip 4 is mounted. Alternatively, bonding of bonding wires 7, 8, and 9 can be conducted together after the lower semiconductor chip 3, heat transmitting conductive plate 5, and upper layer semiconductor chip 4 are mounted.

It is also noted that a heat transmitting conductive plate can be provided, not only between semiconductor chips, but also on side faces of semiconductor chips to surround the chips, including bond wires, for example. In such an arrangement, at least one inlet can be provided that remains uncovered, through which a resin can be injected. This arrangement can expand the noise blocking ability of such a heat transmitting conductive plate to include noise propagated by bond wires, for example.

Figure 21:
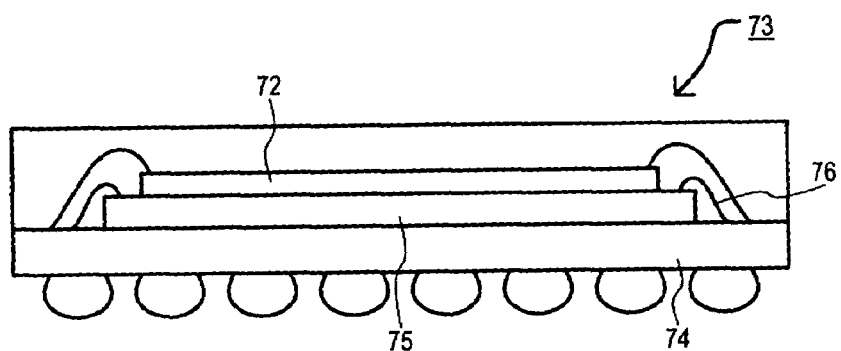
FIG. 21 is a side cross sectional view of a semiconductor device showing one possible modification of a first embodiment of the present invention.

The present invention can include variations in the placement of a heat transmitting conductive plate. In particular, the first embodiment describes a case in which a heat transmitting conductive plate can be interposed between a lower layer semiconductor chip and an upper layer semiconductor chip. However, as shown by FIG. 21, a heat transmitting conductive plate 75 may also be used in a semiconductor device 73 mounted with a single semiconductor chip 72. In particular, a heat transmitting conductive plate 75 can be interposed between a substrate 74 and the semiconductor chip 72. Heat transmitting conductive plate 75 can be connected to a ground wiring of substrate 74 through bonding wire 76, for example.

Figure 22:
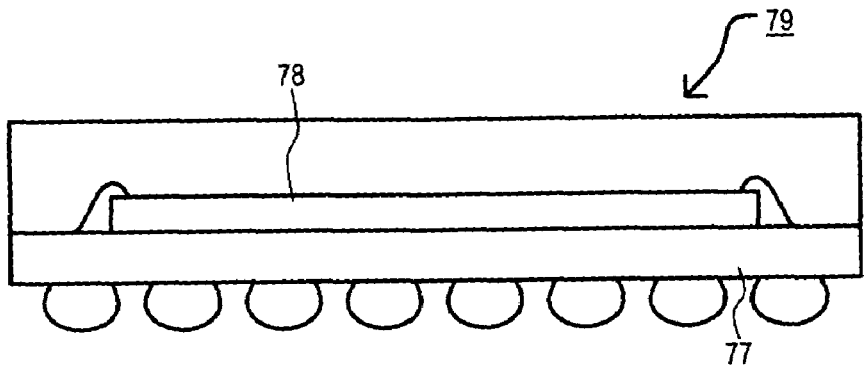
FIG. 22 is a side cross sectional view of a conventional semiconductor device having a single semiconductor chip mounted thereon.

This arrangement can make it possible to block propagation of noise between substrate 74 and semiconductor chip 72 with heat transmitting conductive plate 75, and to dissipate heat generated by semiconductor chip 72 and substrate 74 through heat transmitting conductive plate 75. Accordingly, malfunctions, or the like, can be prevented, and reliability can be improved over a conventional semiconductor device 79, in which a semiconductor chip 78 is mounted directly on a substrate 77, as shown in FIG. 22.

The present invention can include variations in placement multiple semiconductor chips with respect to a heat transmitting conductive plate.

Figure 23:
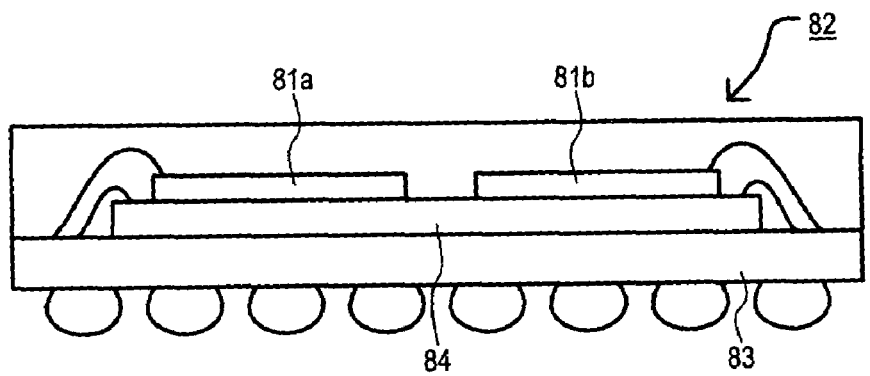
FIG. 23 is a side cross sectional view of a semiconductor device showing another modification of a first embodiment of the present invention.

As shown in FIG. 23, a semiconductor device 82 can include two semiconductor chips 81a and 81b arranged into the same plane. A heat transmitting conductive plate 84 can be interposed between a substrate 83 and semiconductor chips 81a and 81b.

Figure 24:
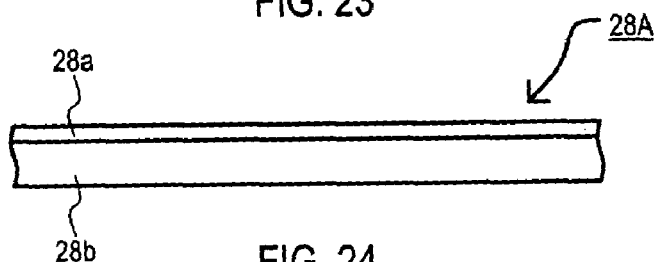
FIG. 24 is a side cross sectional view showing one possible modification of a heat transmitting conductive sheet according to the present invention.

A heat transmitting sheet according to the present invention could also be subject to variation. The above third embodiment describes a case in which a heat transmitting conductive sheet has a sheet-like member that includes a shield layer 28a sandwiched between insulating layers 28b and 28c. However, such a sheet-like member can be replaced by other structures. As but one example, referring to FIG. 24, a heat transmitting conductive sheet 28A can have a simpler structure in which a shield layer 28a is formed on an insulating layer 28b.

The present invention can include variations in the structure of a heat transmitting conductor. That is, a heat transmitting conductor should not be construed as being limited to the plate and sheet-like structures described above. As but one example, a heat transmitting conductive layer can be formed by applying silver paste onto a region of a lower layer semiconductor chip where no terminals or other components are formed. After the heat transmitting conductive layer is formed, an upper layer semiconductor chip can be mounted.

The present invention can include variations in the material from which a heat transmitting conductor is formed. While the above examples have described examples of aluminum and copper, other metals could be used, including but not limited to chromium, silver, and the like.

In other variations, in an arrangement like that of the fourth embodiment, a lower layer semiconductor chip can be directly connected to an upper semiconductor chip, rather than by way of wiring layers within a heat transmitting conductive sheet. Further, in an arrangement like that of the fifth embodiment, corresponding bumps of a lower layer semiconductor chip and upper layer semiconductor chip can be connected to each other through a conductive layer in the heat transmitting conductive sheet.

The present invention can include variations in the facing arrangements of the semiconductor chips mounted therein. For example, the first embodiment describes an arrangement in which two semiconductor chips have circuit forming faces facing upward, whereas the fourth embodiment describes an arrangement in which two semiconductor chips have circuit forming faces opposing one another. However, alternate arrangements of the present invention can include a heat transmitting conductive plate or sheet interposed between semiconductor chips having circuit forming faces both facing downward, or between opposing faces of semiconductor chips in which circuits are not formed.

Figure 25:
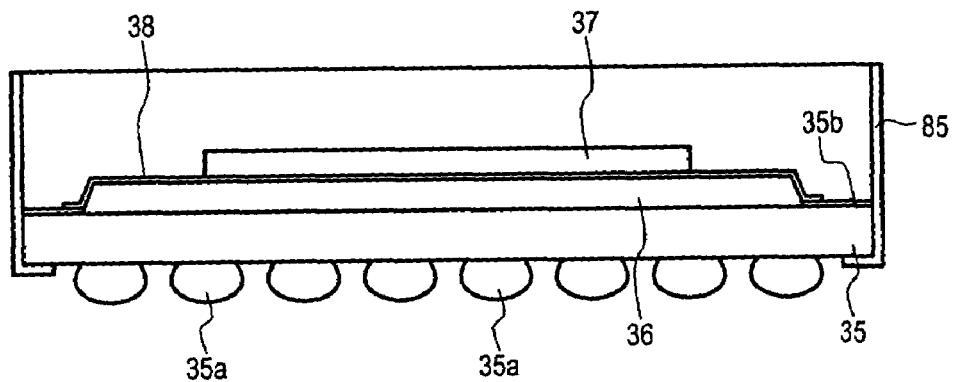
FIG. 25 is a side cross sectional view of a semiconductor device showing one possible modification of a fourth embodiment of the present invention.

The present invention may also include other variations in heat dissipating components. For example, the fourth embodiment describes a case in which a ground wiring can be formed on a perimeter of a top face of a substrate 35. However, as shown in FIG. 25, alternate arrangements can include an additional heat dissipating metal layer (heat dissipating portion) 85 formed on side faces of the device and a bottom face of the substrate 35. Such a heat dissipating metal layer 85 can be connected to a ground wiring 35b. This can ensure heat dissipation to an even greater extent.

The present invention may also include other variations in chip attaching materials. For example, the sixth embodiment describes a case in which a lower semiconductor chip 53 can be lowered and set on a substrate 52 after an adhesive 63, such as silver paste, is applied onto a chip mount face of the substrate 52. However, instead of applying a silver paste, a sheet-like conductive adhesive can be put on the chip mount face before the lower layer semiconductor chip 53 is lowered for mounting.

Of course, while the sixth embodiment shows a structure having a heat transmitting conductive plate 55, alternate embodiments could replace such a component with a heat transmitting conductive sheet structures, such as any of those described above.

Figure 26:
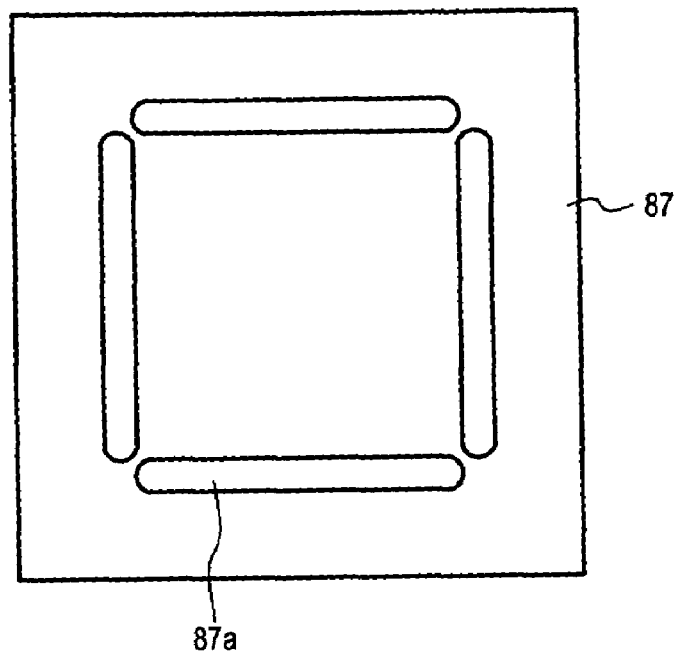
FIG. 26 is a top plan view of a semiconductor device showing one possible modification of a substrate that can be included in a semiconductor device manufactured according to a sixth embodiment
Figure 27:
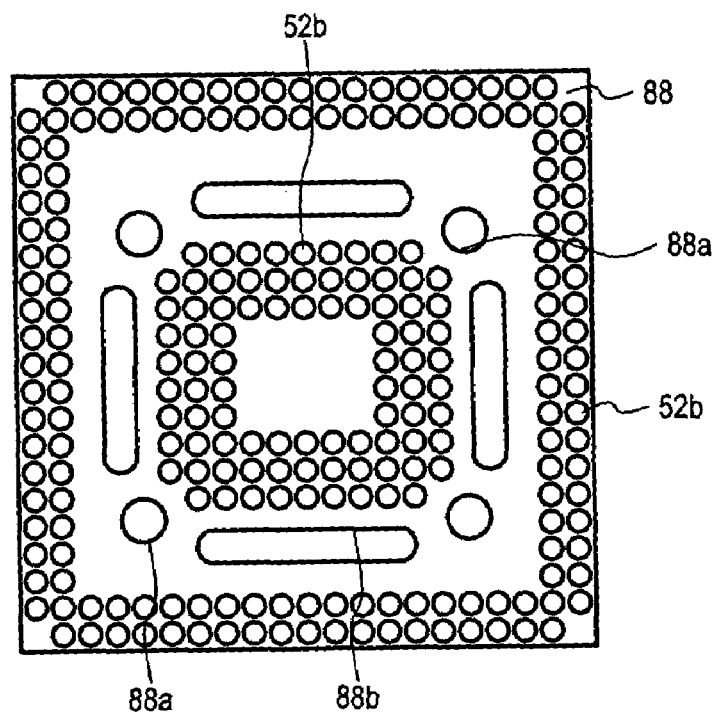
FIG. 27 is bottom plan view showing one possible modification of a substrate that can be included in a semiconductor device manufactured according to a sixth embodiment.

The present invention may also include variations in the configuration of substrate openings for receiving suction portions of a mounting device. For example, the sixth and seventh embodiments describe cases in which a substrate (e.g., 52, 67) can include a large number of through holes (e.g., 52a, 67a) formed in advance. Such through holes (e.g., 52a, 67a) can have a circular shape, and receive have suction portions 61 inserted therein. However, alternate embodiments can include openings of other shapes. As but one example, as shown in FIG. 26, a substrate 87 can have openings 87a that are shaped like grooves, for example, and formed in advance. Such groove shaped openings 87a can enable suction portions 61 to be inserted therein. Alternatively, a substrate can include a mix of different shaped openings. For example, as shown in FIG. 27, a substrate 88 can include both circular through holes (two of which are shown as 88a) as well as groove shaped openings (one of which is shown as 88b).

The present invention may also include variations in substrate structure. That is, a substrate of the present invention should not be limited to a wiring board type configuration. Other embodiments could incorporate a lead frame as a substrate, which can be formed by linking several patterns. Openings or notches could be formed in such a lead frame for receiving suction portions 61 at given positions.

Figure 28:
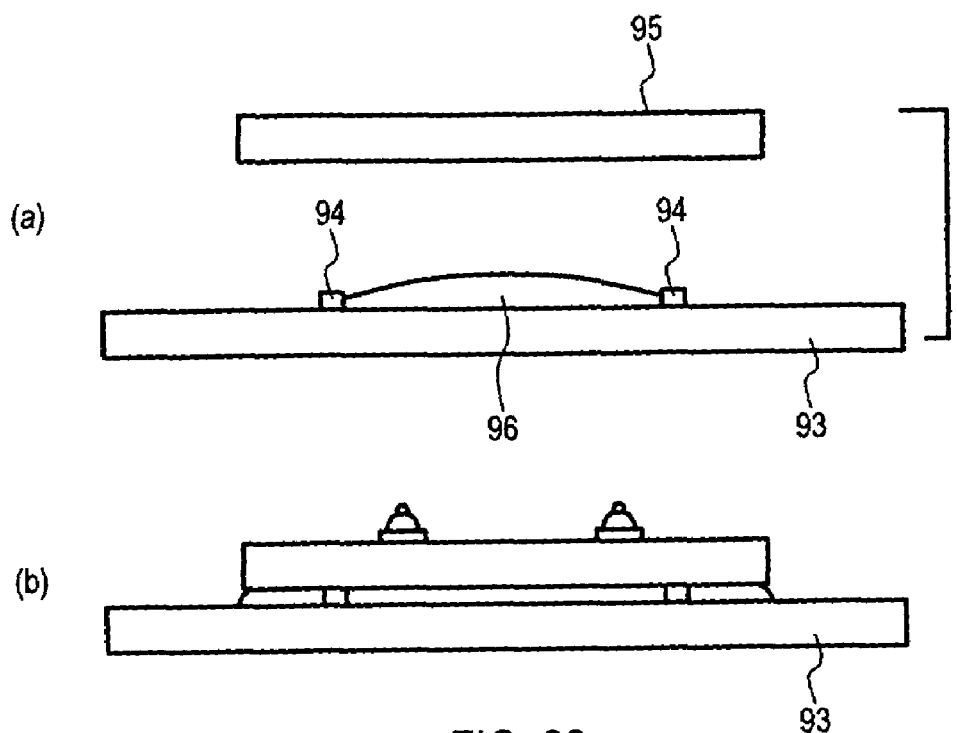
FIGS. 28($a$) and 28($b$) are side cross sectional views showing one possible modification to the manufacturing steps of a sixth embodiment of the present invention.
Figure 29:
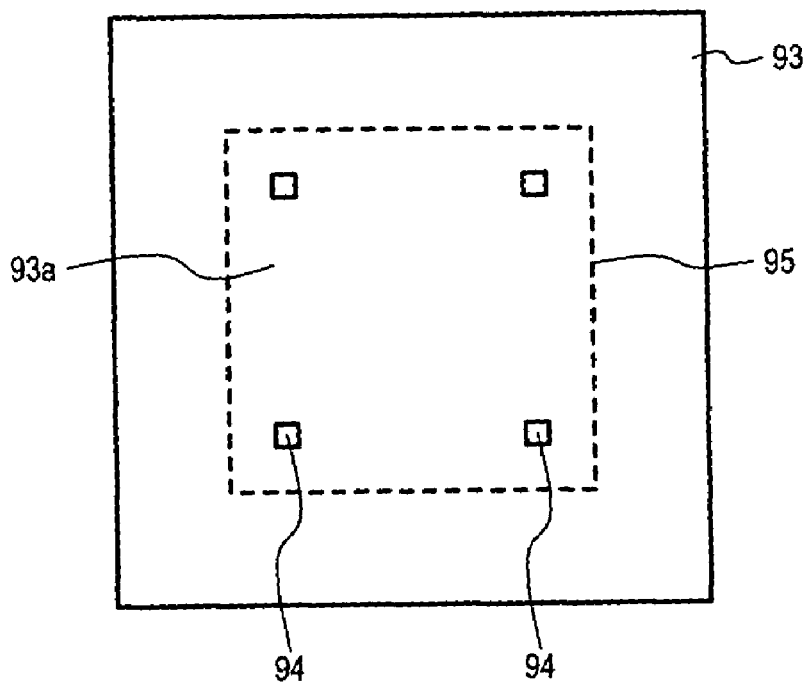
FIG. 29 is a top plan view illustrating the manufacturing method shown in FIGS. 28($a$) and 28($b$).

The present invention may include variations in the manner by which a lower layer semiconductor chip is attached to a substrate. For example, the sixth and seventh embodiments describe cases in which an upper layer semiconductor chip is mounted while a lower layer semiconductor chip is tilted with respect to the substrate. However, as shown in FIGS. 28(a) to 29, a substrate 93 can be provided with columnar spacers 94 of a predetermined height. A sufficient amount of adhesive may then be dripped or otherwise applied to a mount region 93a on a substrate 93. A lower layer semiconductor chip 95 can then be lowered onto columnar spacers 94, and thereby attached to substrate 93.

Figure 30:
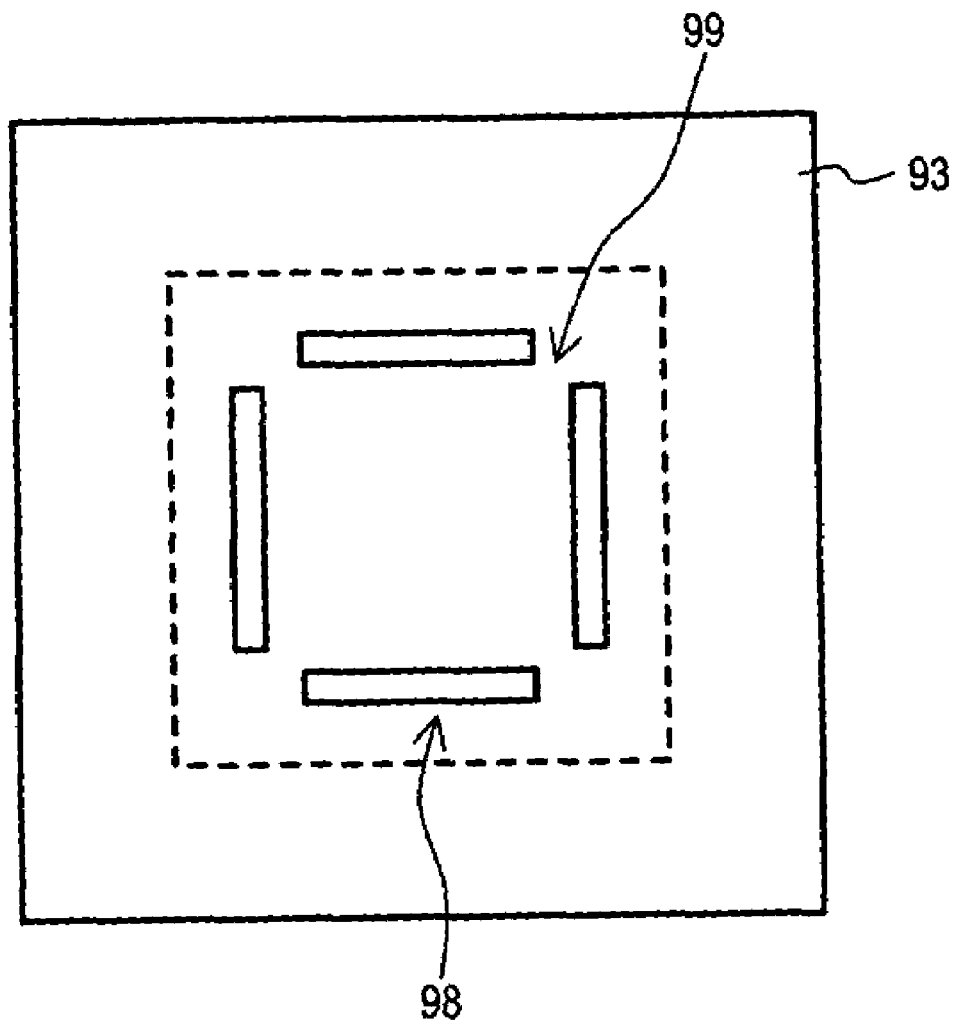
FIG. 30 is top plan view showing another possible modification of a substrate that can be included in a semiconductor device manufactured according to a sixth embodiment.
Figure 31:
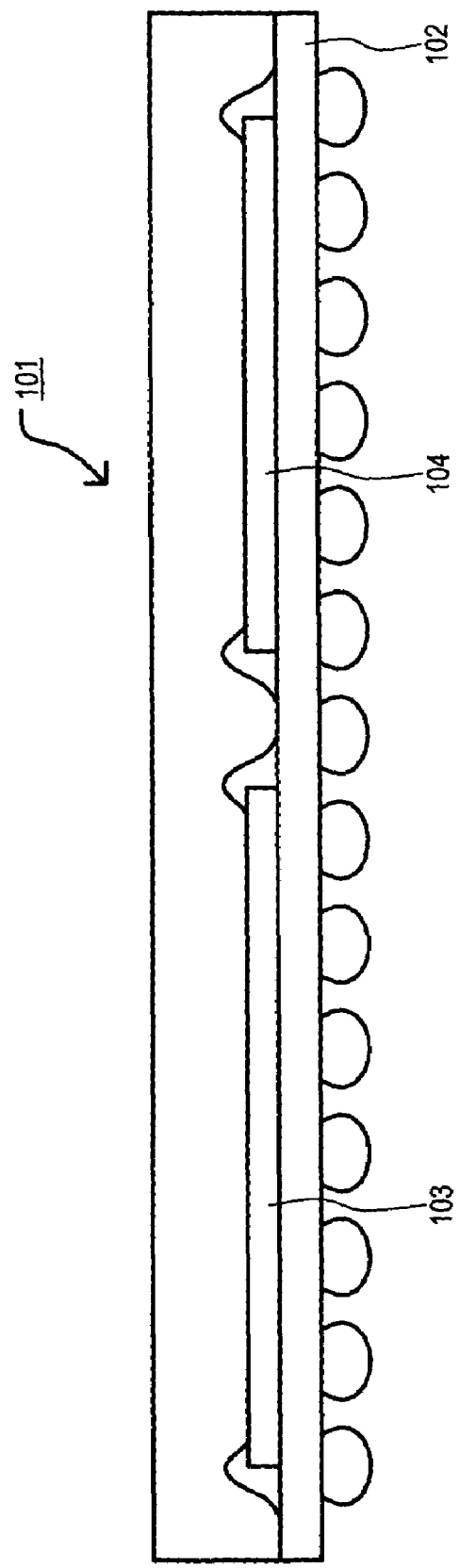
FIG. 31 is a side cross sectional view of a first example of a conventional semiconductor device.
Figure 32:
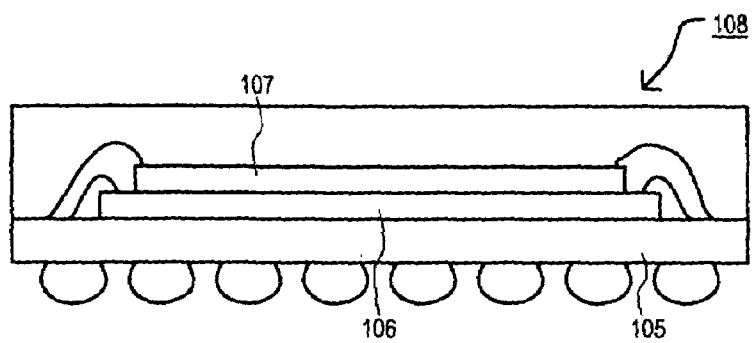
FIG. 32 is a side cross sectional view of a second example of a conventional semiconductor device.
Figure 33:
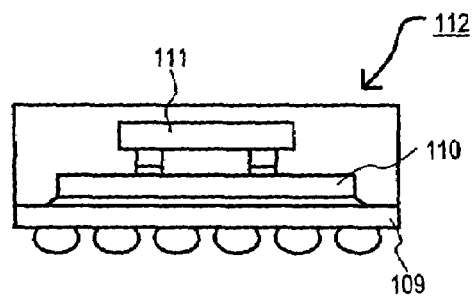
FIG. 33 is a side cross sectional view of a third example of a conventional semiconductor device.
Figure 34:
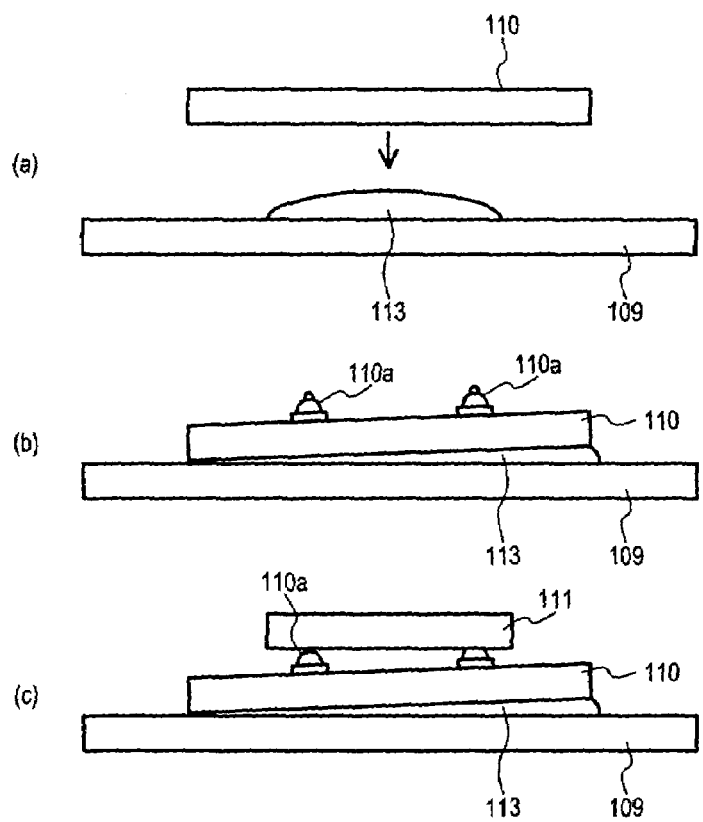
FIGS. 34($a$) to 34($c$) are side cross sectional views showing a conventional method of manufacturing a semiconductor device.

As an alternative, as shown in FIG. 30, a substrate 93 can be provided with a frame-like dam portion 98, having notches 99 formed in the four corners of the dam portion 98. A sufficient amount of adhesive may then be dripped or otherwise applied to a mount region on substrate 93 within the dam portion 98. A lower layer semiconductor chip can then be lowered onto dam portion 98 and thereby attached to substrate 93.

The present invention may include variations in the manner by which chips are connected to one another. For example, the sixth and seventh embodiments describe a method of manufacturing a COC type semiconductor device, in which two semiconductor devices have circuit forming faces opposing one another, and connected to one another by bumps, or the like. Alternate embodiments can include different chip connection arrangements. As but one example, two semiconductor chips can be stacked and mounted on a substrate with circuit forming faces both facing upward. An upper layer semiconductor device can include through holes formed therein and bumps formed on a bottom surface. The bumps on the bottom surface can be connected to a circuit formed in the top surface by way of the through holes. The bumps on the bottom surface of the upper layer semiconductor chip can provide a connection to the circuit forming face of the lower layer semiconductor chip.

As described above, according to a semiconductor device of the present invention, a first semiconductor chip and second semiconductor chip can be arranged in a vertical direction, thus reductions in device size can be achieved. In addition, a heat transmitting conductor can be provided that is connected to ground and interposed between a first semiconductor chip and second semiconductor chip, to block the propagation of noise between the first semiconductor chip and second semiconductor chip.

Heat generated by the first semiconductor chip and second semiconductor chip can be transmitted by contact points with the heat transmitting conductor, and dissipated therefrom. This can improve the heat dissipating capability and contribute to more stable operation. Reliability of the semiconductor device can thus be improved.

A first semiconductor chip and second semiconductor chip can be electrically connected to a substrate through a heat transmitting conductor, thus a step of connecting a first semiconductor chip and/or second semiconductor chip by other means, such as a wire bonding step, can be omitted.

Also, an electrical connection between a first semiconductor chip and a second semiconductor chip can be through a heat transmitting conductor. This can increase the degree in freedom in circuit design, including greater freedom in the placement of terminals that provide external connection to the first semiconductor chip or second semiconductor chip.

According to manufacturing methods of the present invention, the adverse affect of fluctuations in adhesive thickness can be removed. Thus, breakage and damage to a lower layer semiconductor chip, for example, can be avoided. In this way yield can be improved and higher degrees of reliability can be ensured.

It is noted that while the various embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A semiconductor device comprising a substrate, a first semiconductor chip located over the substrate, a first heat-transmitting and electromagnetic-noise-blocking substance interposed between said first heat-transmitting and electromagnetic-noise-blocking substance serving to diffuse heat generated between said first semiconductor chip and said first heat-transmitting and electromagnetic-noise-blocking substance, and block electromagnetic noise between said first semiconductor chip and said substrate, a second semiconductor chip located over said substrate with intervention of said first semiconductor chip and the first heat-transmitting and electromagnetic-noise-blocking substance therebetween, and a second heat-transmitting and electromagnetic-noise-blocking substance that is interposed between said first and second semiconductor chips, said second heat-transmitting and electromagnetic-noise-blocking substance serving to diffuse heat generated by said second semiconductor chip and block electromagnetic noise affecting the second semiconductor chip.

2. The semiconductor device of claim 1, wherein the first semiconductor chip is located over the substrate without intervention of another semiconductor chip therebetween.

3. The semiconductor device of claim 1, wherein at least one heat-transmitting and electromagnetic-noise-blocking substance is electrically connected to a ground wiring of said substrate for providing a ground potential.

4. The semiconductor device of claim 3, wherein the ground wiring is formed along substantially the entire perimeter of a top face of the substrate.

5. The semiconductor device of claim 3, wherein:
a heat dissipating member is physically connected to the ground wiring and provided on a side face of the semiconductor device.

6. The semiconductor device of claim 1, wherein:
at least one of the first and second semiconductor chips has a digital circuit formed therein and the other one of the first and second semiconductor chips has an analog circuit formed therein.

7. The semiconductor device of claim 1, wherein:
each of the first and second heat-transmitting and electro-magnetic-noise-blocking substances is selected from the group consisting of: a conductive plate, a conductive sheet, a metal plate, a metal sheet, a conductive sheet having a shield portion and at least one lead portion extending from an edge thereof a laminate structure comprising a conductive heat transmitting layer and at least one wiring layer that electrically connects the first semiconductor chip and the second semiconductor chip, a laminate structure comprising a conductive heat transmitting layer and a plurality of connection holes formed therein for enabling direct electrical connections between the first semiconductor chip and the second semiconductor chip, a laminate structure comprising a conductive heat transmitting layer and at least one wiring layer that electrically connects at least one of the first semiconductor chip and the second semiconductor chip to substrate connections, a structure comprising aluminum, a structure comprising copper, and a structure comprising silver.

* * * * *